US008823085B2

(12) United States Patent
Masuoka et al.

(10) Patent No.: US 8,823,085 B2
(45) Date of Patent: Sep. 2, 2014

(54) METHOD FOR PRODUCING A SEMICONDUCTOR DEVICE AND SEMICONDUCTOR DEVICE

(71) Applicant: Unisantis Electronics Singapore Pte. Ltd., Singapore (SG)

(72) Inventors: Fujio Masuoka, Tokyo (JP); Hiroki Nakamura, Tokyo (JP)

(73) Assignee: Unisantis Electronics Singapore Pte. Ltd., Singapore (SG)

( * ) Notice: Subject to any disclaimer, the term of this patent is extended or adjusted under 35 U.S.C. 154(b) by 0 days.

(21) Appl. No.: 13/960,089

(22) Filed: Aug. 6, 2013

(65) Prior Publication Data

US 2014/0042526 A1     Feb. 13, 2014

Related U.S. Application Data

(60) Provisional application No. 61/680,781, filed on Aug. 8, 2012.

(51) Int. Cl.
*H01L 29/66* (2006.01)
*H01L 29/78* (2006.01)

(52) U.S. Cl.
CPC .......... *H01L 29/66795* (2013.01); *H01L 29/78* (2013.01); *H01L 29/66* (2013.01); *H01L 29/785* (2013.01)
USPC ........................................................ 257/329

(58) Field of Classification Search
USPC ................................... 438/268; 257/327, 329
See application file for complete search history.

(56) References Cited

U.S. PATENT DOCUMENTS 8,076,190 B2 * 12/2011 Chen et al. ..................... 438/197

FOREIGN PATENT DOCUMENTS

| JP | 2-71556 A | 3/1990 |
| JP | 2-188966 A | 7/1990 |
| JP | 3-145761 A | 6/1991 |
| JP | 2009-182317 A | 8/2009 |

OTHER PUBLICATIONS

Yang, B., et al., "Vertical Silicon-Nanowire Formation and Gate-All-Around MOSFET", IEEE Electron Device Letters, pp. 791-794, Jul. 2008, vol. 29, No. 7.
Wu, C.C., et al., "High Performance 22/20nm FinFET CMOS Devices with Advanced High-K/Metal Gate Scheme", IEEE International Electron Devices(IEDM2010), Dec. 2010, 10.1109/IEDM.2010.5703430.

* cited by examiner

*Primary Examiner* — Matthew W Such
*Assistant Examiner* — Monica D Harrison
(74) *Attorney, Agent, or Firm* — Laurence A. Greenberg; Werner H. Stemer; Ralph E. Locher

(57) ABSTRACT

A SGT-production method includes forming a fin-shaped silicon layer on a silicon substrate, forming a first insulating film around the fin-shaped silicon layer, forming a pillar-shaped silicon layer in an upper portion of the fin-shaped silicon layer, where the pillar-shaped silicon layer has the same width as the fin-shaped silicon layer, forming a gate insulating film around the pillar-shaped silicon layer, forming, around the gate insulating film, a metal film and a polysilicon film thinner than the width of the pillar-shaped silicon layer, forming a third resist for forming a gate line, performing anisotropic etching to form the gate line, depositing a fourth resist, exposing the polysilicon film on a sidewall of an upper portion of the pillar-shaped silicon layer, removing the exposed polysilicon film by etching, removing the fourth resist, removing the metal film by etching, and forming a gate electrode connecting to the gate line.

4 Claims, 34 Drawing Sheets

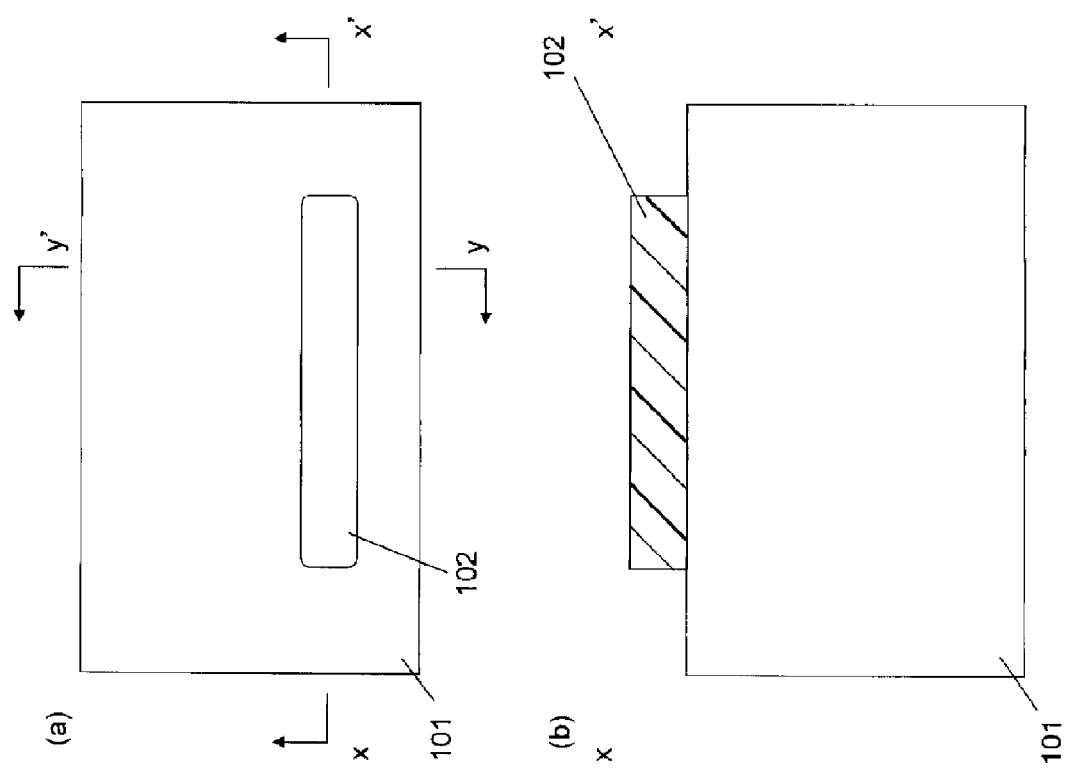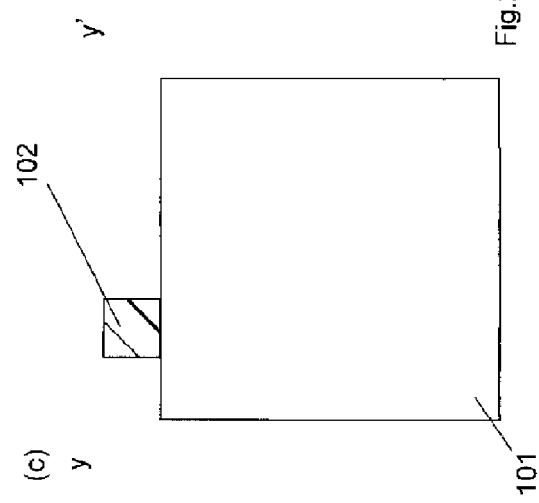
Fig.2

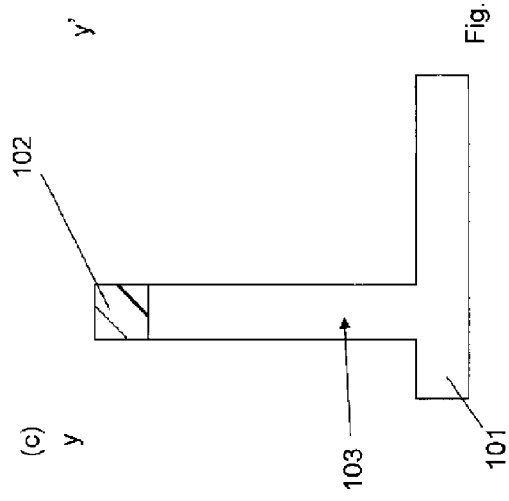
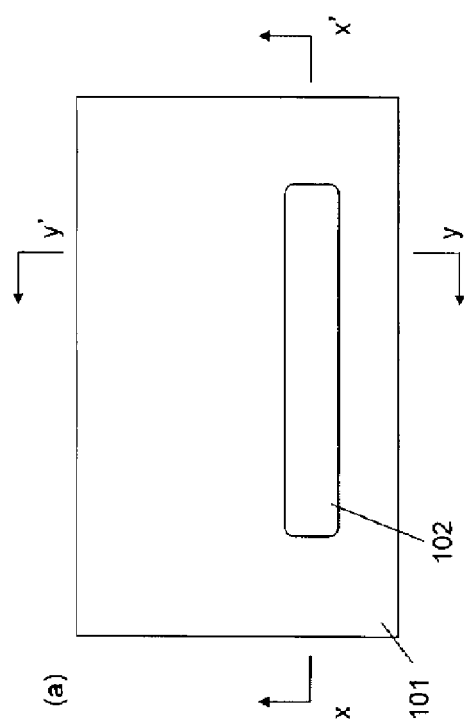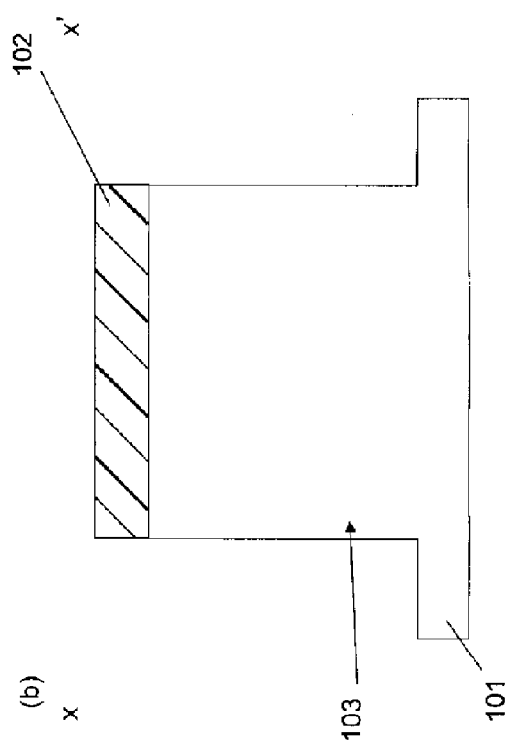
Fig.3

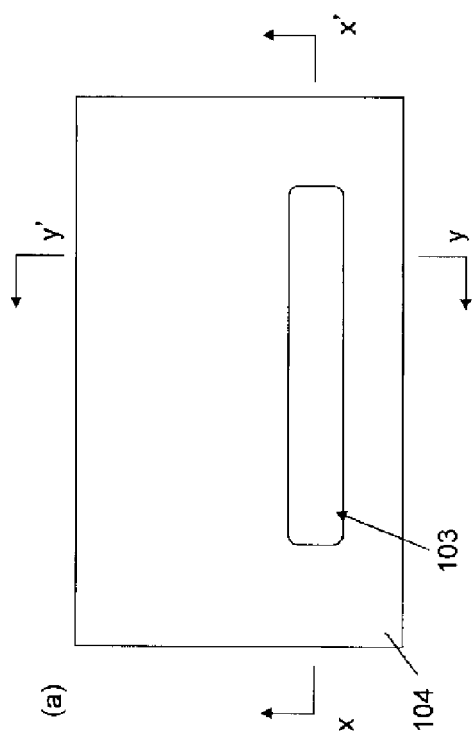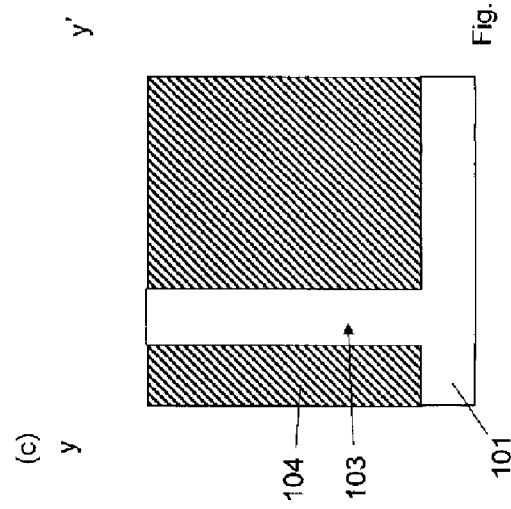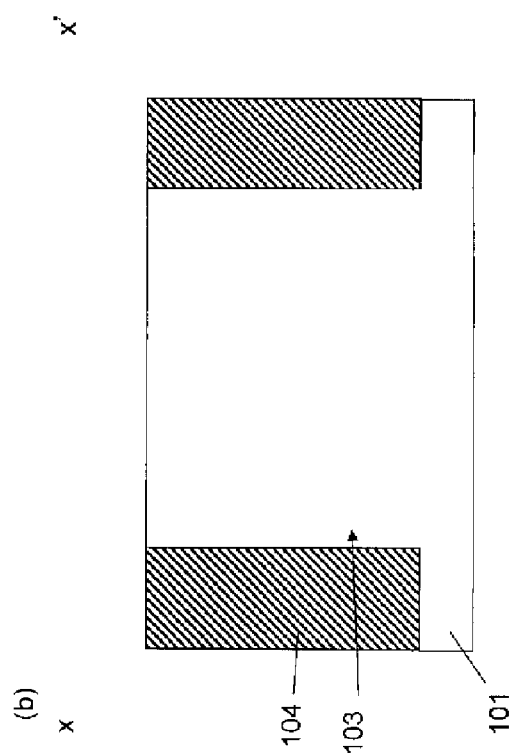
Fig. 5

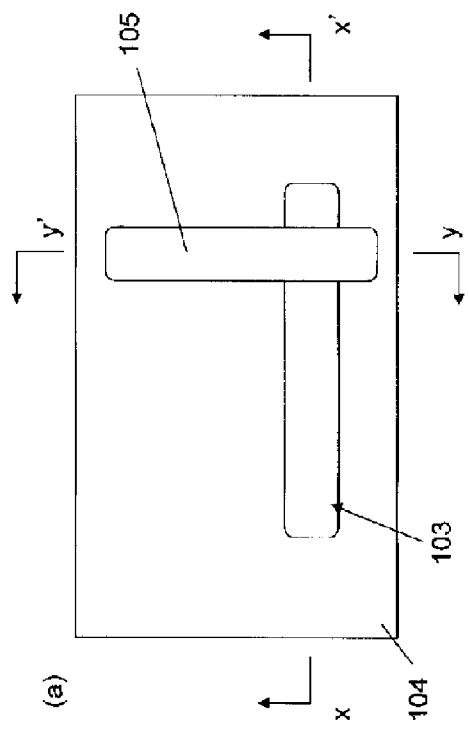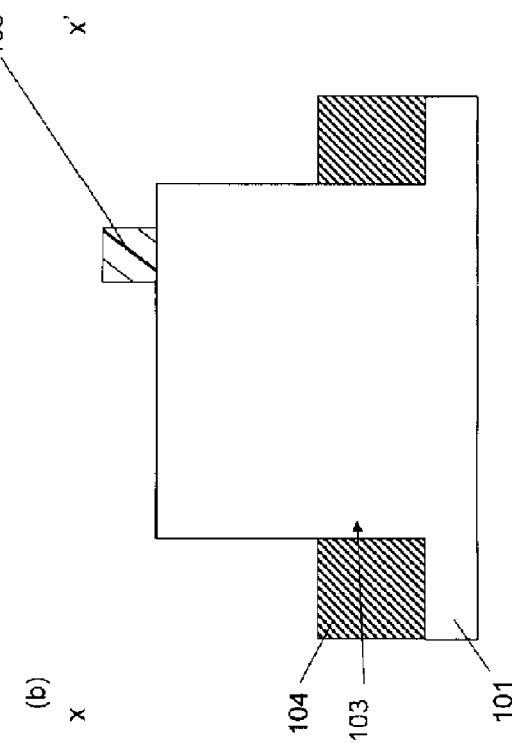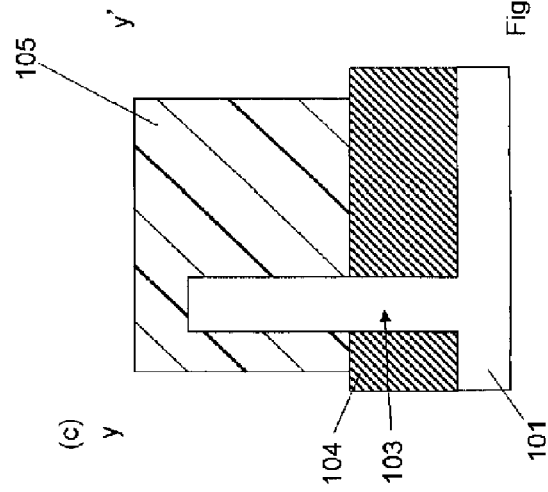
Fig. 7

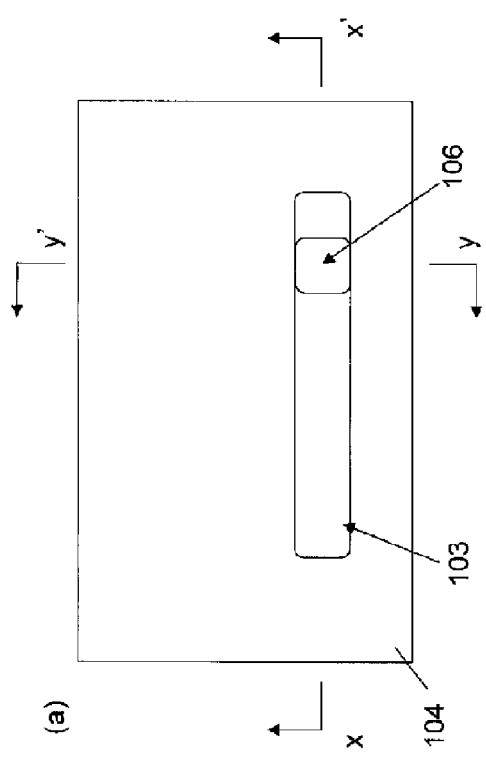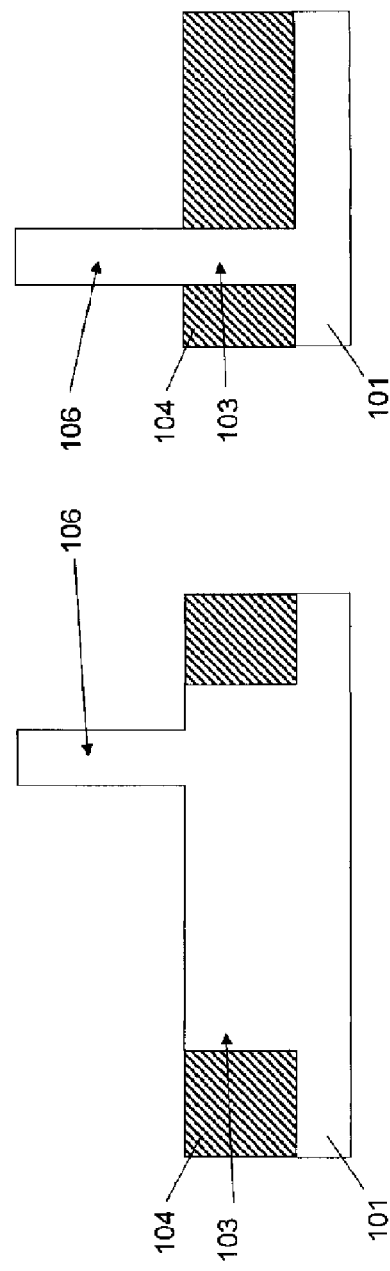
Fig. 9

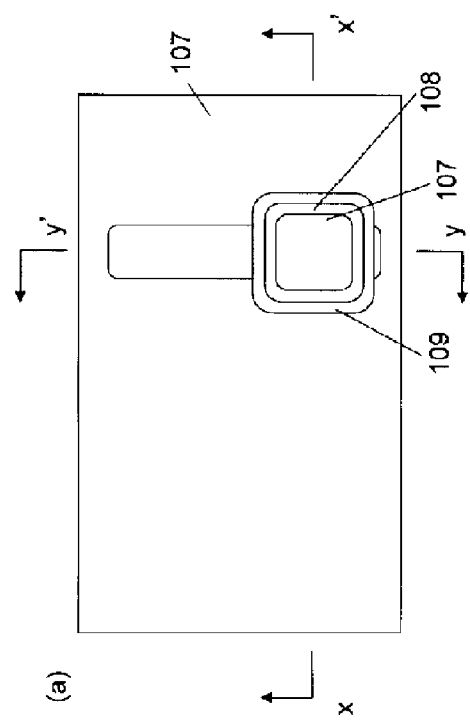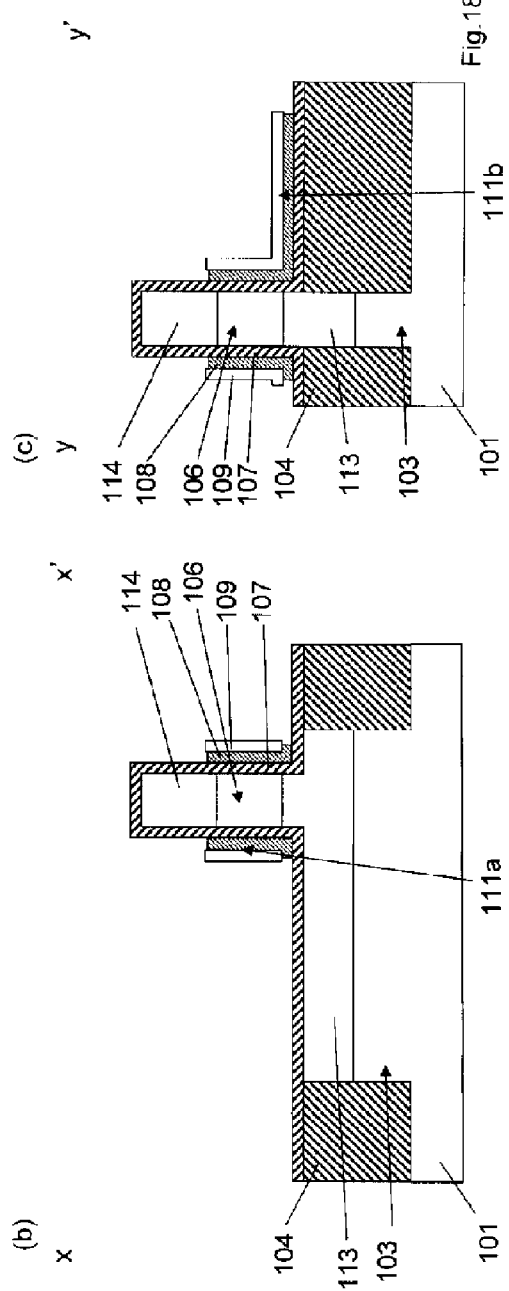
Fig. 18

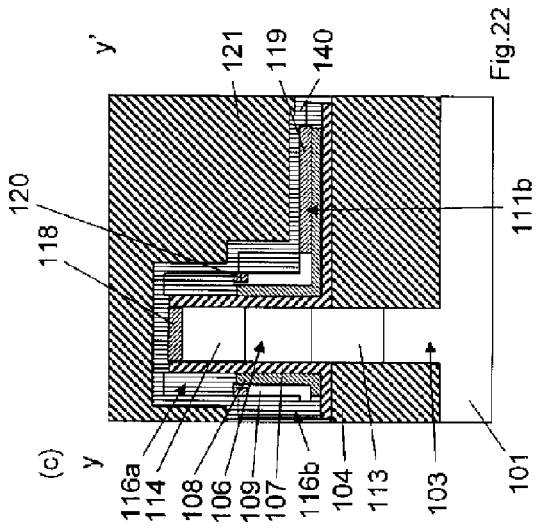
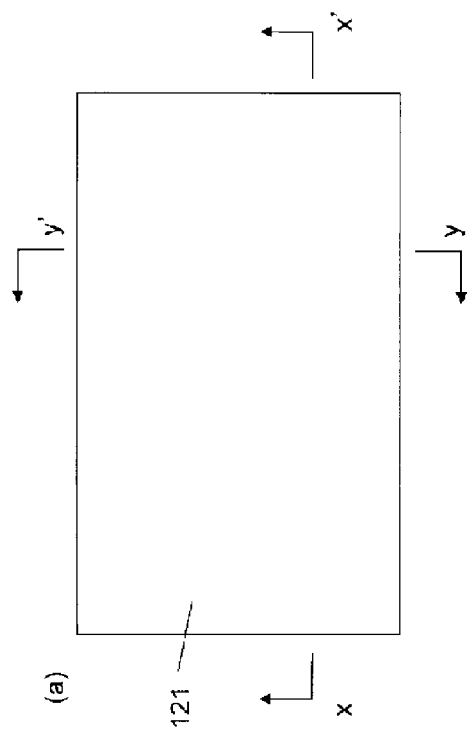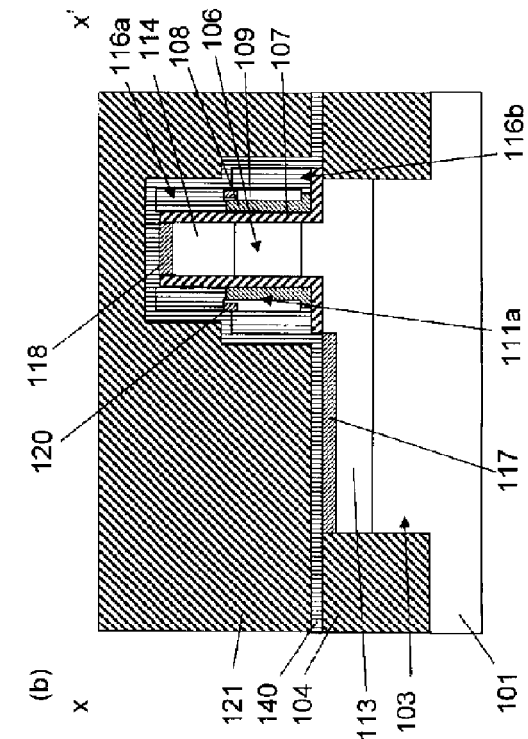
Fig.22

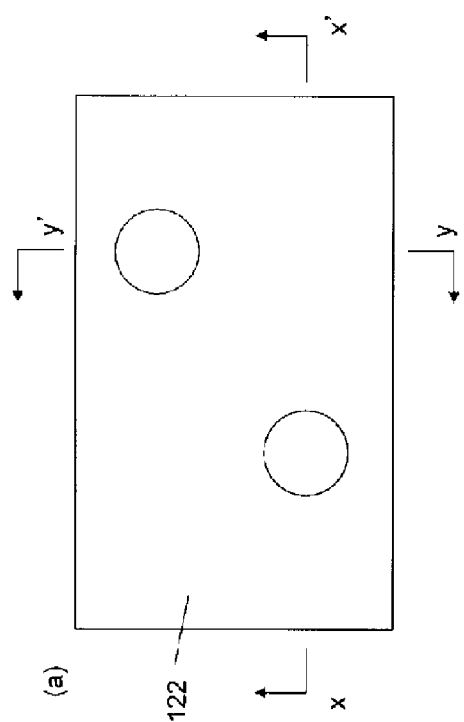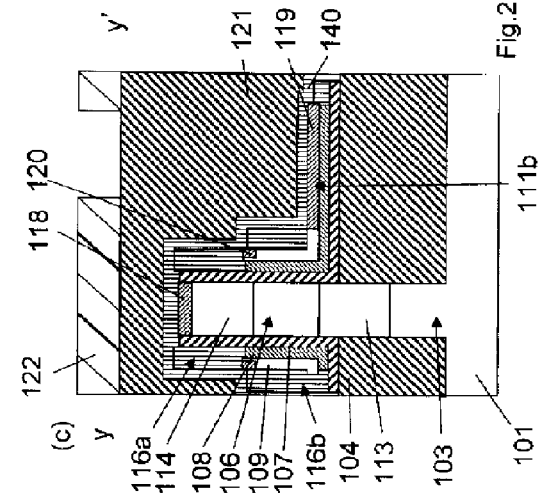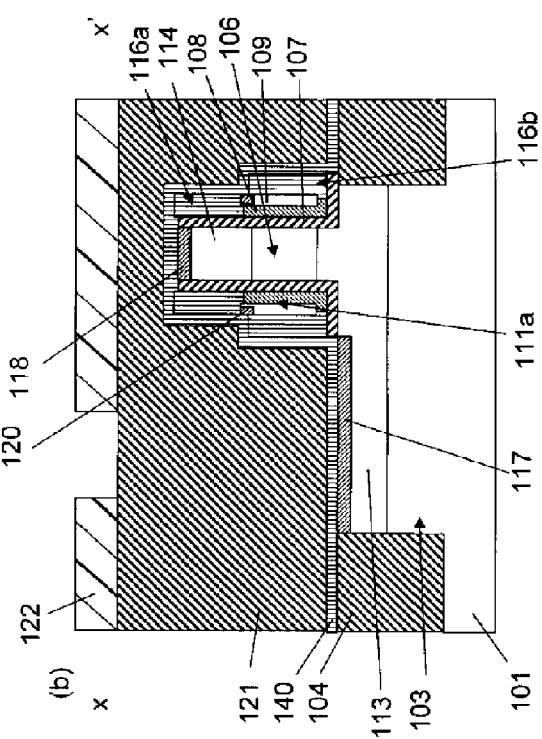
Fig.23

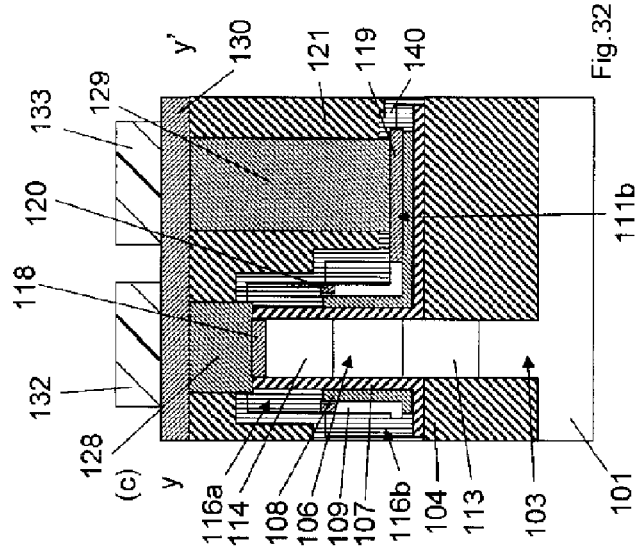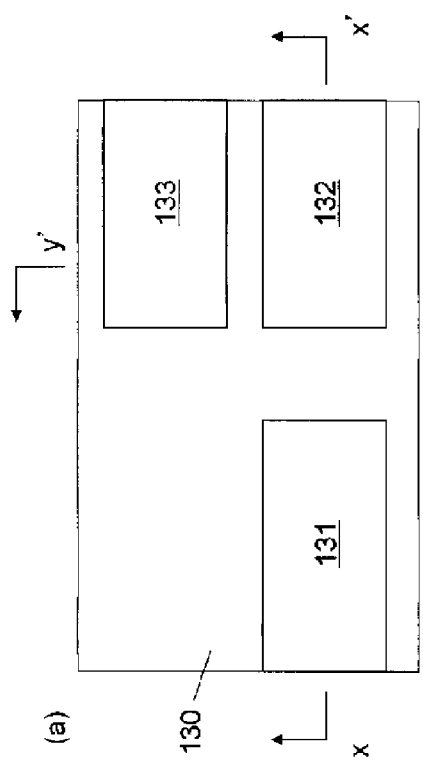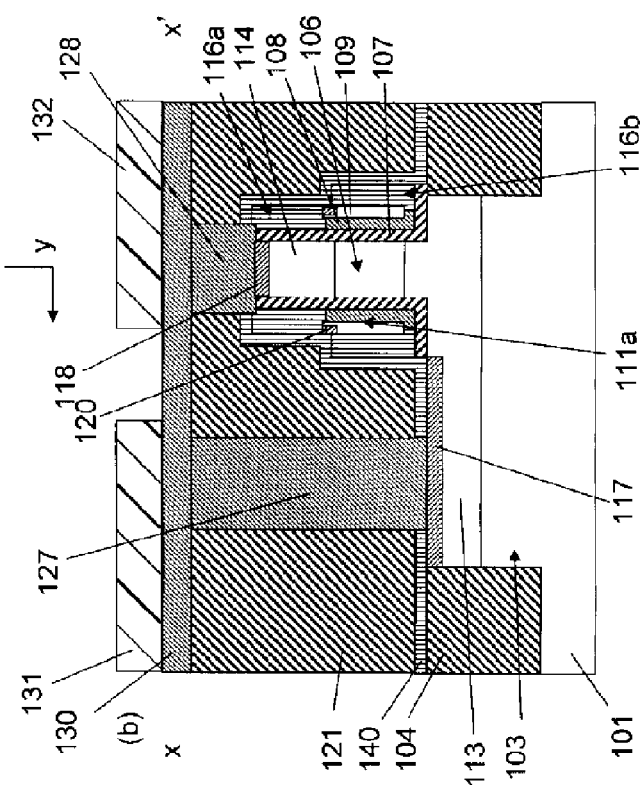
Fig. 32

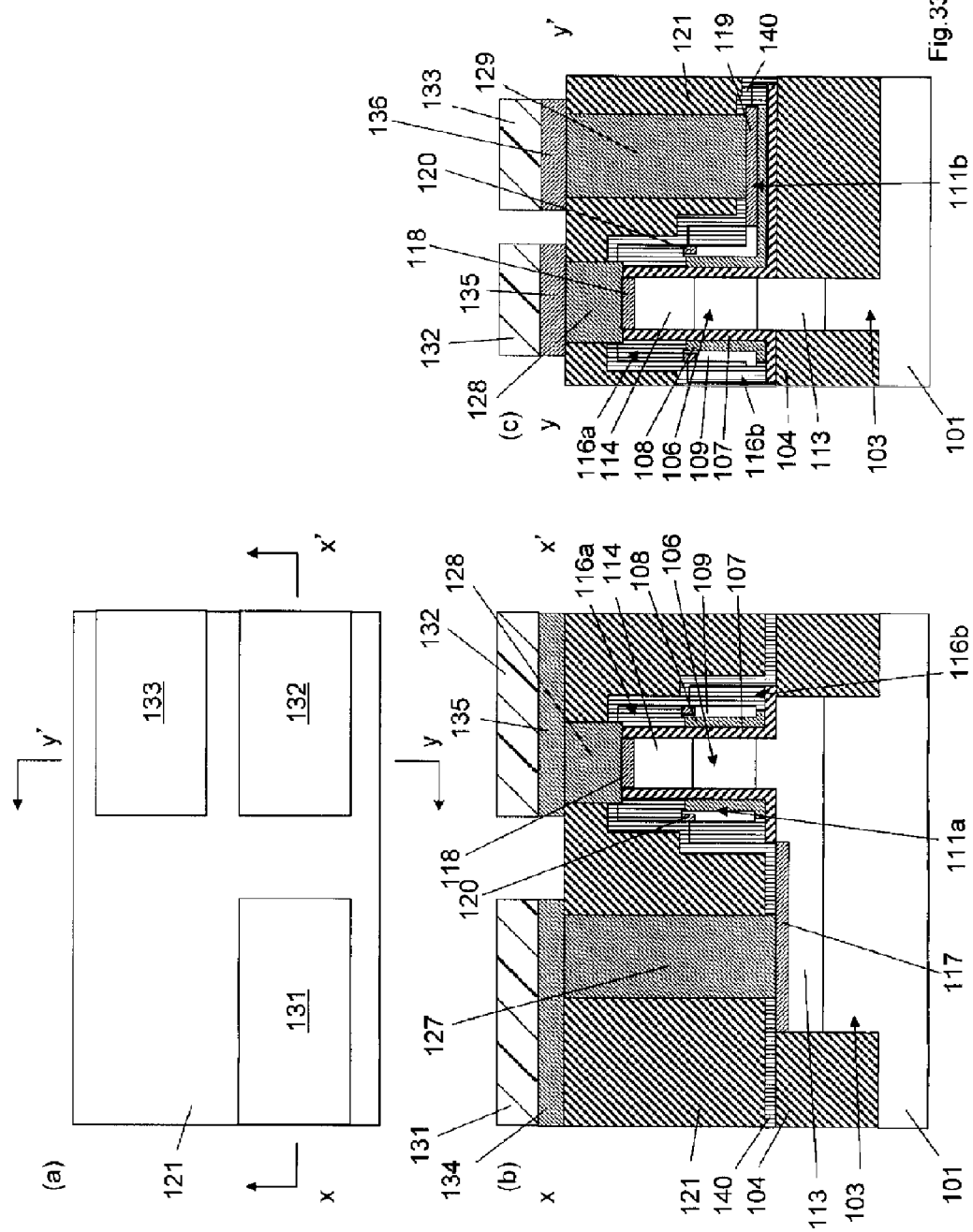

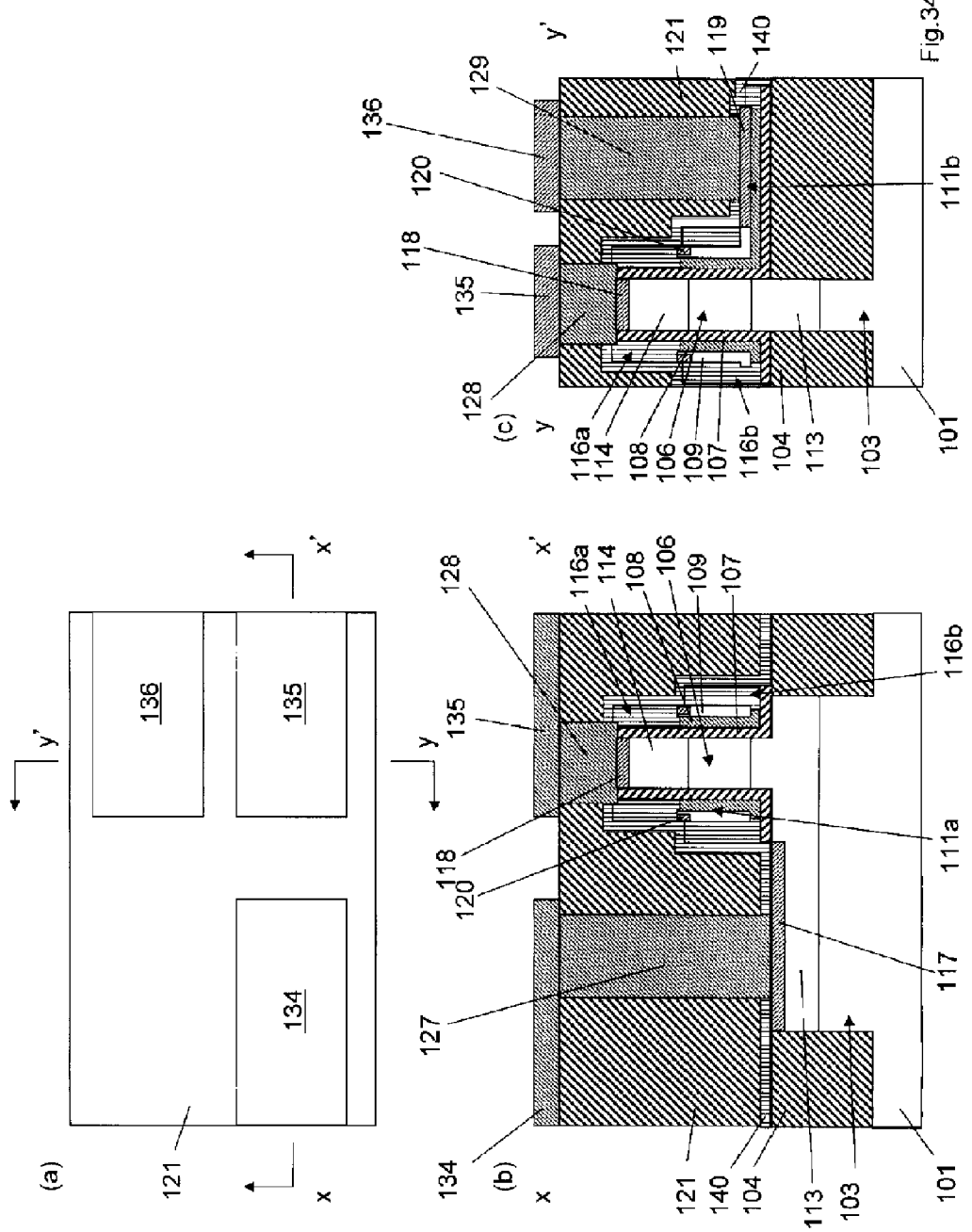

METHOD FOR PRODUCING A SEMICONDUCTOR DEVICE AND SEMICONDUCTOR DEVICE

CROSS-REFERENCE TO RELATED APPLICATION

This application claims the benefit, under 35 U.S.C. §119 (e), of provisional patent application No. 61/680,781, filed Aug. 8, 2012; the prior application is herewith incorporated by reference in its entirety.

BACKGROUND OF THE INVENTION

Field of the Invention

The present invention relates to a method for producing a semiconductor device and a semiconductor device.

Increasingly higher degrees of integration continue to be achieved in semiconductor integrated circuits, especially integrated circuits that use MOS transistors. With the increase in the degree of integration, MOS transistors used in integrated circuits have scaled down to the nanometer order. As the miniaturization of the MOS transistors proceeds, it is becoming increasingly difficult to suppress leak current and to reduce the area occupied by the circuits while maintaining a required amount of current. In order to address these challenges, surrounding gate transistors (referred to as "SGTs" hereinafter) in which a source, a gate, and a drain are arranged in a direction perpendicular to a substrate and a gate electrode surrounds a pillar-shaped semiconductor layer have been proposed (for example, refer to Japanese Unexamined Patent Application No. 2-71556, Japanese Unexamined Patent Application No. 2-188966, and Japanese Unexamined Patent Application No. 3-145761).

According to a conventional method for producing SGTs, a silicon pillar in which a nitride film hard mask is formed on a silicon pillar is formed, a diffusion layer is formed in a lower portion of the silicon pillar, a gate material is then deposited, the gate material is then planarized and etched back, and an insulating film sidewall is formed on a sidewall of the silicon pillar and the nitride film hard mask. Then a resist pattern for a gate line is formed, the gate material is etched, the nitride film hard mask is removed, and a diffusion layer is formed in an upper portion of the silicon pillar (for example, refer to Japanese Unexamined Patent Application No. 2009-182317).

In this method, in the cases where intervals between silicon pillars are narrow and a thick gate material must be deposited between the silicon pillars, holes called voids are sometimes formed between the silicon pillars. Formation of voids leads to formation of holes in the gate material after etch back. When an insulating film is deposited to form the insulating film sidewall, the insulating film is deposited in the voids. Accordingly, it becomes more difficult to work with the gate material.

To address this, a proposal has been made (for example, refer to B. Yang, K. D. Buddharaju, S. H. G. Teo, N. Singh, G. D. Lo, and D. L. Kwong, "Vertical Silicon-Nanowire Formation and Gate-All-Around MOSFET", IEEE Electron Device Letters, VOL. 29, No. 7, July 2008, pp 791-794) in which a gate oxide film is formed after formation of a silicon pillar, a thin polysilicon is deposited, a resist covering an upper portion of the silicon pillar and for forming a gate line is then formed, a gate line is etched, an oxide film is then thickly deposited, the upper portion of the silicon pillar is exposed, the thin polysilicon on the upper portion of the silicon pillar is removed, and the thick oxide film is removed by wet etching.

However, a method in which a metal is used in the gate electrode is not described. Moreover, a resist covering an upper portion of the silicon pillar and for forming a gate line must be formed and the upper portion of the silicon pillar must be covered; thus, this method is not a self-aligned process.

In order to decrease the parasitic capacitance between the gate line and the substrate, a conventional MOS transistor uses a first insulating film. For example, in a FINFET (refer to High performance 22/20 nm FinFET CMOS devices with advanced high-K/metal gate scheme, IEDM2010, CC. Wu, et. al, 27.1.1-27.1.4, for example), a first insulating film is formed around one fin-shaped semiconductor layer and is etched back to expose the fin-shaped semiconductor layer so as to decrease the parasitic capacitance between the gate line and the substrate. Thus, the first insulating film must be used to decrease the parasitic capacitance between the gate line and the substrate in the SGT also. Since a SGT includes a pillar-shaped semiconductor layer in addition to a fin-shaped semiconductor layer, adjustment must be made for forming the pillar-shaped semiconductor layer.

SUMMARY OF THE INVENTION

Accordingly, an object is to provide a method for producing a SGT through a self-aligned process in which the parasitic capacitance between a gate line and a substrate is reduced, a thin gate material is used, and a metal gate is used, and to provide a SGT structure obtained by the method.

A method for producing a semiconductor device according to the present invention includes:

a first step of forming a fin-shaped silicon layer on a silicon substrate, forming a first insulating film around the fin-shaped silicon layer, and forming a pillar-shaped silicon layer in an upper portion of the fin-shaped silicon layer, the pillar-shaped silicon layer having a width equal to a width of the fin-shaped silicon layer;

after the first step, a second step of forming a gate insulating film around the pillar-shaped silicon layer, forming a metal film and a polysilicon film around the gate insulating film, forming a third resist for forming a gate line, and performing anisotropic etching to form the gate line, the polysilicon film having a thickness smaller than the width of the pillar-shaped silicon layer; and after the second step, a third step of depositing a fourth resist, exposing the polysilicon film on a sidewall of an upper portion of the pillar-shaped silicon layer, removing the exposed polysilicon film by etching, removing the fourth resist, removing the metal film by etching, and forming a gate electrode connecting to the gate line.

The first step includes forming a first resist for forming the fin-shaped silicon layer on the silicon substrate, etching the silicon substrate, forming the fin-shaped silicon layer, removing the first resist, depositing the first insulating film around the fin-shaped silicon layer, etching back the first insulating film, exposing an upper portion of the fin-shaped silicon layer, forming a second resist that orthogonally intersects the fin-shaped silicon layer, etching the fin-shaped silicon layer, and removing the second resist so that a portion where the fin-shaped silicon layer orthogonally intersects the second resist forms the pillar-shaped silicon layer.

The method may further include a fourth step of forming a first diffusion layer in an upper portion of the pillar-shaped silicon layer and forming a second diffusion layer in a lower portion of the pillar-shaped silicon layer and an upper portion of the fin-shaped silicon layer.

The method may further include a fifth step of forming silicides on the first diffusion layer, on the second diffusion layer, and in the gate line.

A semiconductor device according to the present invention includes:

a fin-shaped silicon layer formed on a silicon substrate;

a first insulating film formed around the fin-shaped silicon layer;

a pillar-shaped silicon layer formed on the fin-shaped silicon layer, the pillar-shaped silicon layer having a width equal to a width of the fin-shaped silicon layer;

a gate insulating film formed around the pillar-shaped silicon layer;

a gate electrode having a laminated structure that includes a metal film and a polysilicon film formed around the gate insulating film, the polysilicon film having a thickness smaller than the width of the pillar-shaped silicon layer;

a gate line that is connected to the gate electrode and extends in a direction orthogonally intersecting the fin-shaped silicon layer;

a second diffusion layer formed in an upper portion of the fin-shaped silicon layer and in a lower portion of the pillar-shaped silicon layer;

a first diffusion layer formed in an upper portion of the pillar-shaped silicon layer;

a silicide formed in an upper portion of the second diffusion layer; and a silicide formed in an upper portion of the first diffusion layer.

The gate line has a laminated structure that includes the metal film and a silicide.

The present invention can provide a method for producing a SGT thorough a self-aligned process, in which the parasitic capacitance between the gate line and the substrate is reduced, a thin gate material is used, and a metal gate is used. A SGT structure produced by the method is also provided. Since formation of the fin-shaped silicon layer, the first insulating film, and the pillar-shaped silicon layer is based on the conventional methods for producing FINFETs, the production is easy.

Moreover, a self-aligned process is achieved in the second step of forming a gate insulating film around the pillar-shaped silicon layer, forming a metal film and a polysilicon film around the gate insulating film, forming a third resist for forming a gate line, and performing anisotropic etching to form the gate line, the polysilicon film having a thickness smaller than the width of the pillar-shaped silicon layer, and, after the second step, in the third step of depositing a fourth resist, exposing the polysilicon film on a side wall of the upper portion of the pillar-shaped silicon layer, removing the exposed polysilicon film by etching, removing the fourth resist, removing the metal film by etching, and forming a gate electrode connecting to the gate line. The degree of integration can be increased because of the self-aligned process.

Moreover, the gate line has a laminated structure that includes the metal film and the silicide. Since the silicide and the metal film make direct contact with each other, the resistance can be decreased.

Other features which are considered as characteristic for the invention are set forth in the appended claims.

Although the invention is illustrated and described herein as embodied in method for producing semiconductor device and semiconductor device, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE SEVERAL VIEWS OF THE DRAWING

FIG. 1(c) is a cross-sectional view taken along line y-y' in (a).

FIG. 2(a) is a plan view related to a method for producing a semiconductor device according to the present invention, FIG. 2(b) is a cross-sectional view taken along line x-x' in (a), and FIG. 2(c) is a cross-sectional view taken along line y-y' in (a).

FIG. 3(a) is a plan view related to a method for producing a semiconductor device according to the present invention, FIG. 3(b) is a cross-sectional view taken along line x-x' in (a), and FIG. 3(c) is a cross-sectional view taken along line y-y' in (a).

FIG. 5(a) is a plan view related to a method for producing a semiconductor device according to the present invention, FIG. 5(b) is a cross-sectional view taken along line x-x' in (a), and FIG. 5(c) is a cross-sectional view taken along line y-y' in (a).

FIG. 7(a) is a plan view related to a method for producing a semiconductor device according to the present invention, FIG. 7(b) is a cross-sectional view taken along line x-x' in (a), and FIG. 7(c) is a cross-sectional view taken along line y-y' in (a).

FIG. 9(a) is a plan view related to a method for producing a semiconductor device according to the present invention, FIG. 9(b) is a cross-sectional view taken along line x-x' in (a), and FIG. 9(c) is a cross-sectional view taken along line y-y' in (a).

FIG. 18(a) is a plan view related to a method for producing a semiconductor device according to the present invention, FIG. 18(b) is a cross-sectional view taken along line x-x' in (a), and FIG. 18(c) is a cross-sectional view taken along line y-y' in (a).

FIG. 22(a) is a plan view related to a method for producing a semiconductor device according to the present invention, FIG. 22(b) is a cross-sectional view taken along line x-x' in (a), and FIG. 22(c) is a cross-sectional view taken along line y-y' in (a).

FIG. 23(a) is a plan view related to a method for producing a semiconductor device according to the present invention, FIG. 23(b) is a cross-sectional view taken along line x-x' in (a), and FIG. 23(c) is a cross-sectional view taken along line y-y' in (a).

FIG. 32(a) is a plan view related to a method for producing a semiconductor device according to the present invention, FIG. 32(b) is a cross-sectional view taken along line x-x' in (a), and FIG. 32(c) is a cross-sectional view taken along line y-y' in (a).

FIG. 33(a) is a plan view related to a method for producing a semiconductor device according to the present invention, FIG. 33(b) is a cross-sectional view taken along line x-x' in (a), and FIG. 33(c) is a cross-sectional view taken along line y-y' in (a).

FIG. 34(a) is a plan view related to a method for producing a semiconductor device according to the present invention, FIG. 34(b) is a cross-sectional view taken along line x-x' in (a), and FIG. 34(c) is a cross-sectional view taken along line y-y' in (a).

DETAILED DESCRIPTION OF THE INVENTION

Figure 1:
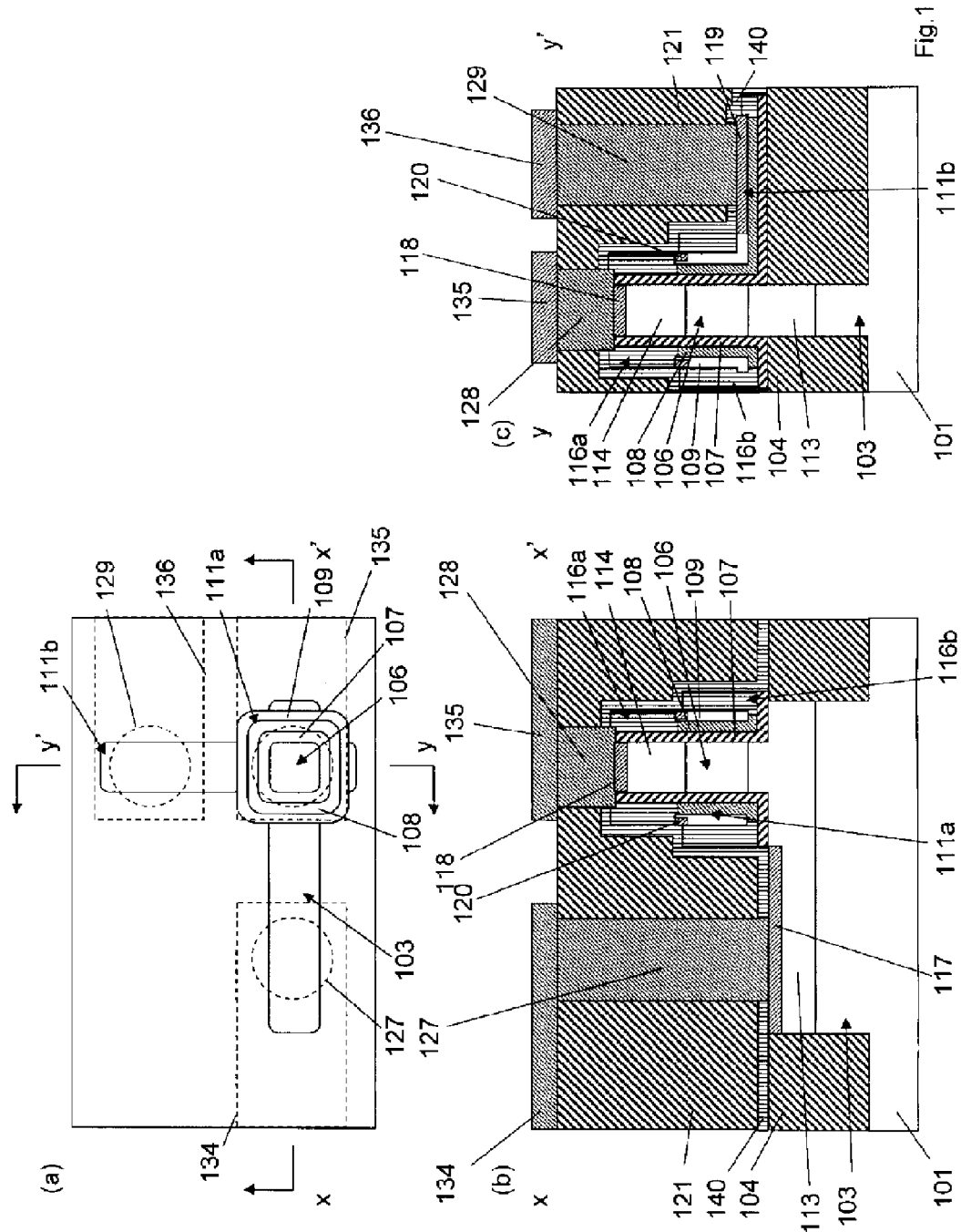
FIG. 1(a) is a plan view of a semiconductor device according to the present invention.
FIG. 1(c) is a cross-sectional view taken along line x-x' in (a)

Production steps for forming a SGT structure according to an embodiment of the present invention are described below with reference to FIGS. 2 to 34.

First, a production method in which a fin-shaped silicon layer 103 is formed on a silicon substrate 101, a first insulating film 104 is formed around the fin-shaped silicon layer 103, and a pillar-shaped silicon layer 106 is formed in an upper portion of the fin-shaped silicon layer 103 is described. As shown in FIG. 2, a first resist 102 for forming a fin-shaped silicon layer is formed on the silicon substrate 101.

As shown in FIG. 3, the fin-shaped silicon layer 103 is formed by etching the silicon substrate 101. Although a resist is used this time as a mask to form a fin-shaped silicon layer, a hard mask such as an oxide film or a nitride film may alternatively be used.

Figure 4:
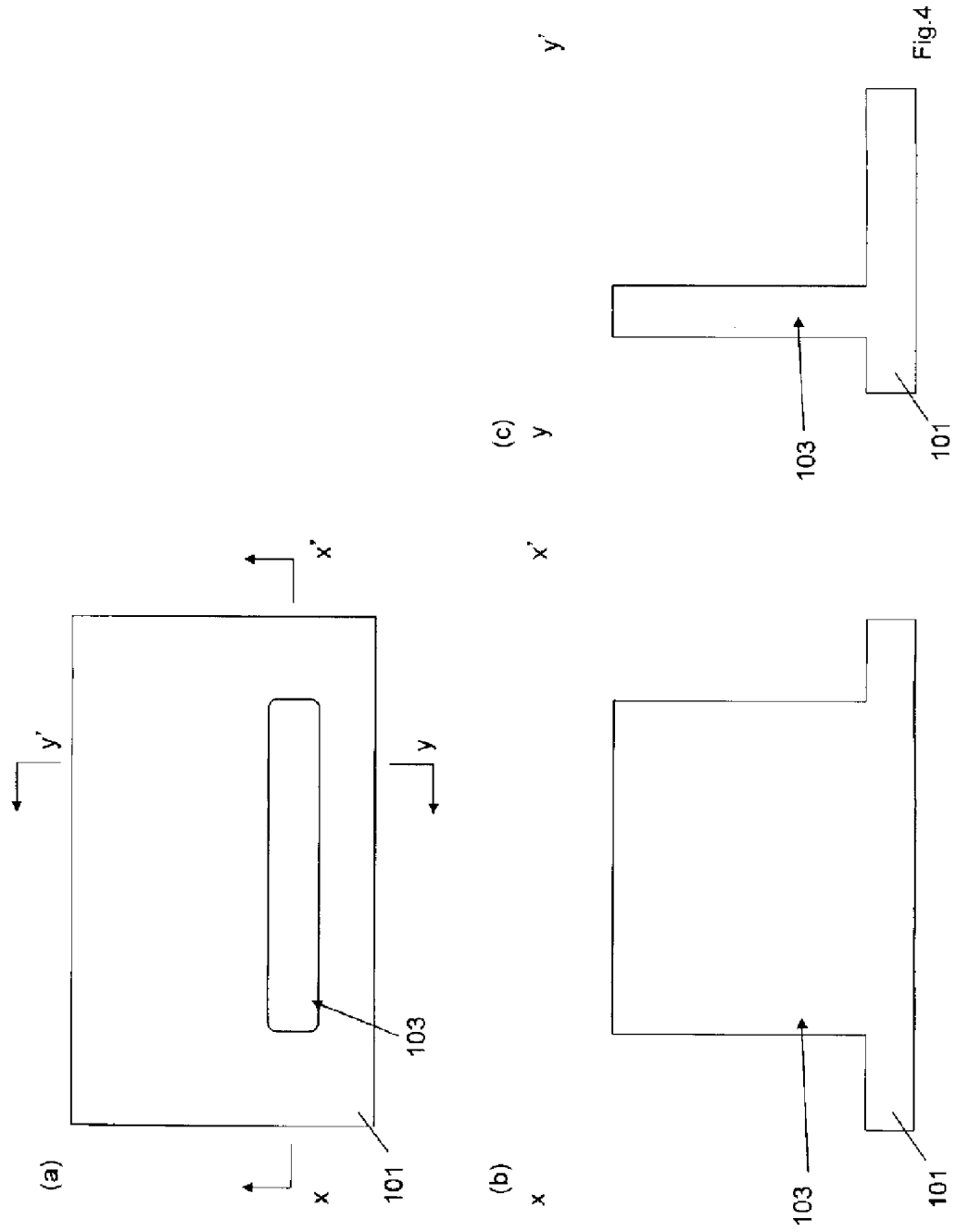
FIG. 4(a) is a plan view related to a method for producing a semiconductor device according to the present invention.
FIG. 4(b) is a cross-sectional view taken along line x-x' in (a)
FIG. 4(c) is a cross-sectional view taken along line y-y' in (a).

As shown in FIG. 4, the first resist 102 is removed.

As shown in FIG. 5, a first insulating film 104 is deposited around the fin-shaped silicon layer 103. An oxide film formed by high-density plasma or an oxide film formed by low-pressure chemical vapor deposition may be used as the first insulating film, for example.

Figure 6:
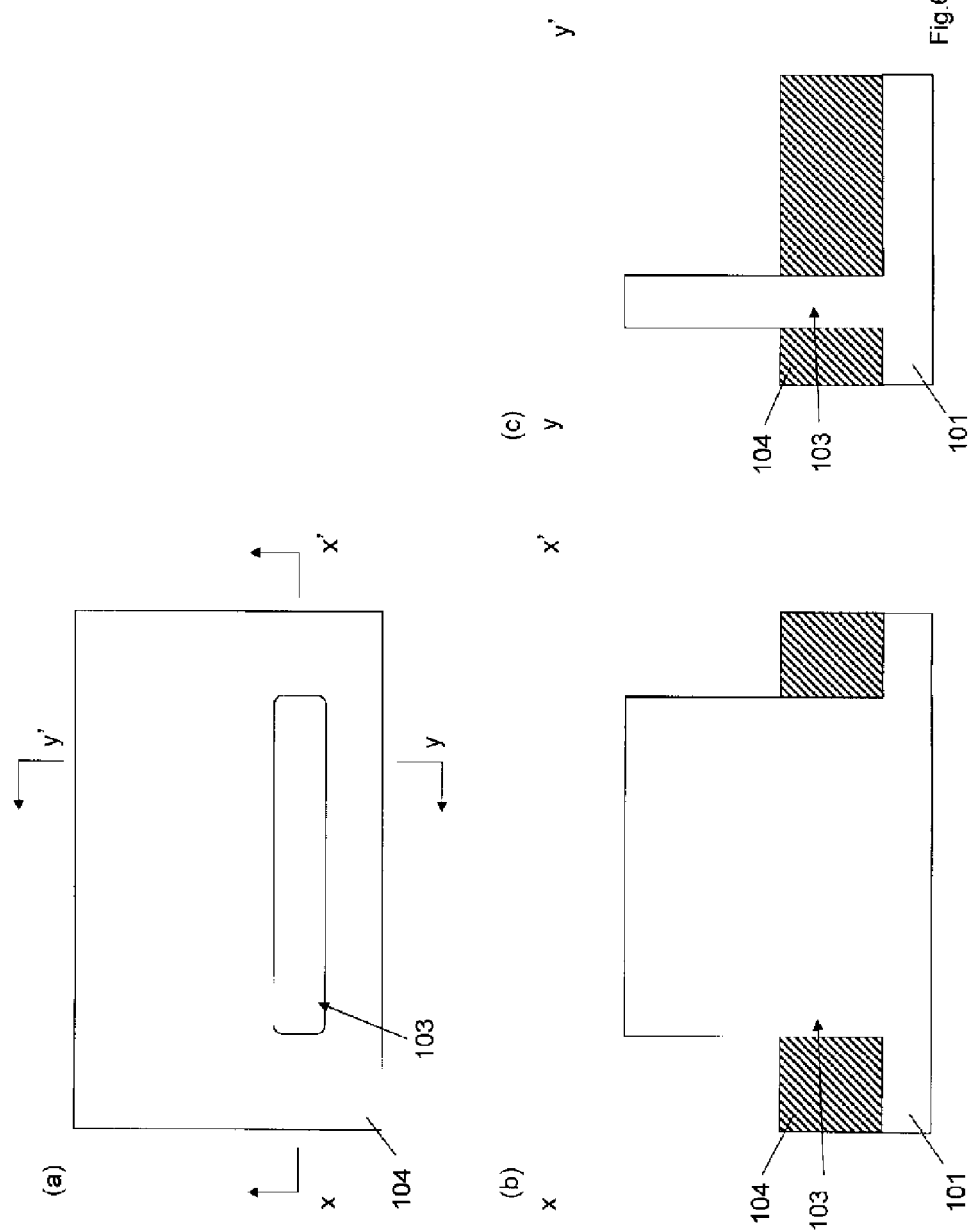
FIG. 6(a) is a plan view related to a method for producing a semiconductor device according to the present invention.
FIG. 6(b) is a cross-sectional view taken along line x-x' in (a)
FIG. 6(c) is a cross-sectional view taken along line y-y' in (a).

As shown in FIG. 6, the first insulating film 104 is etched back to expose an upper portion of the fin-shaped silicon layer 103. The steps up to and including this are the same as those of the method for producing a fin-shaped silicon layer in Patent Literature 2.

As shown in FIG. 7, a second resist 105 is formed so as to orthogonally intersect the fin-shaped silicon layer 103. The part where the fin-shaped silicon layer 103 and the resist 105 orthogonally intersect is the portion that will form a pillar-shaped silicon layer. Since a line-shaped resist can be used, the possibility of breaking of the resist after formation of the pattern is low and the process becomes stable.

Figure 8:
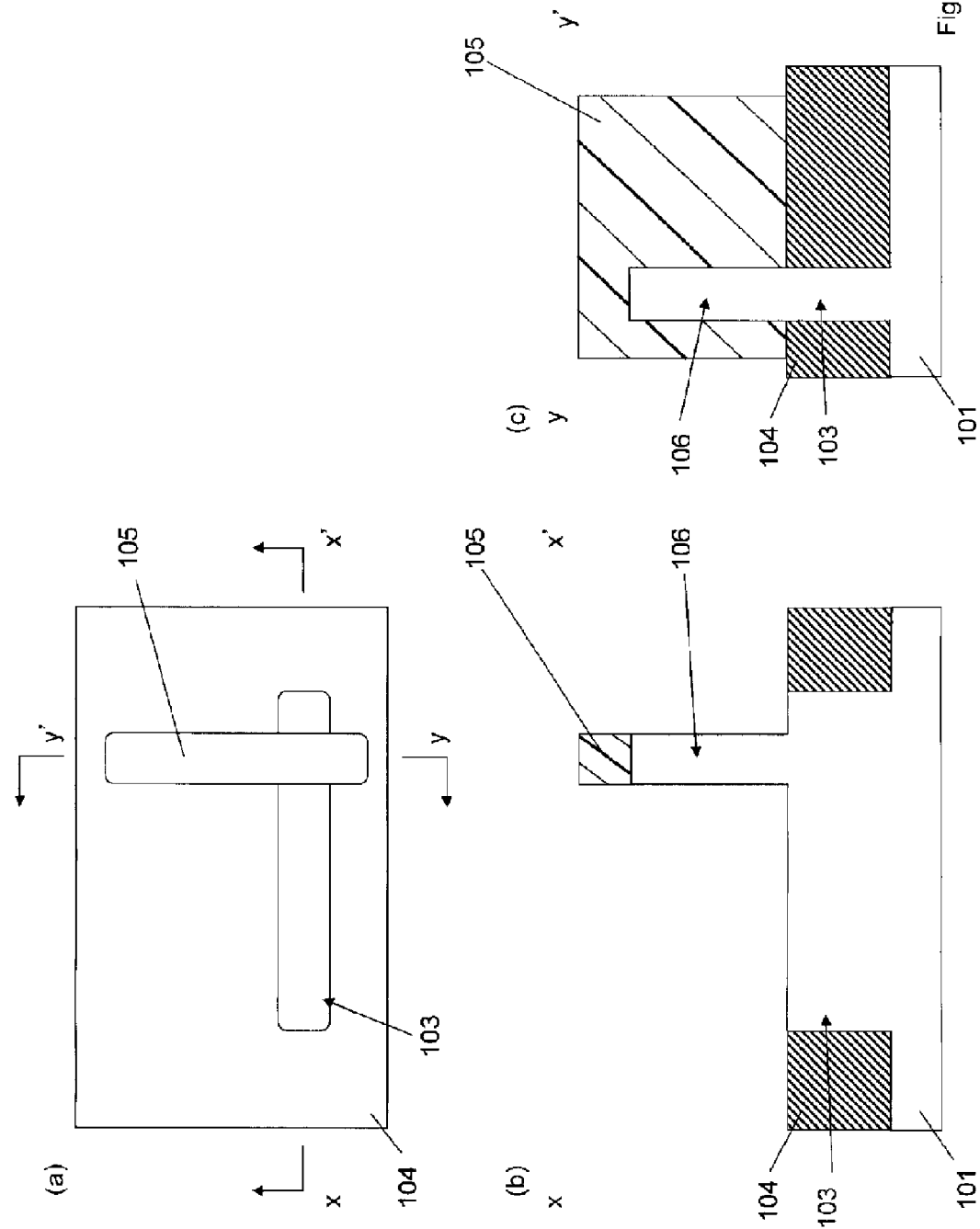
FIG. 8(a) is a plan view related to a method for producing a semiconductor device according to the present invention.
FIG. 8(b) is a cross-sectional view taken along line x-x' in (a)
FIG. 8(c) is a cross-sectional view taken along line y-y' in (a).

As shown in FIG. 8, the fin-shaped silicon layer 103 is etched. The portion where the fin-shaped silicon layer 103 and the second resist 105 orthogonally intersect forms the pillar-shaped silicon layer 106. Accordingly, the width of the pillar-shaped silicon layer 106 is equal to the width of the fin-shaped silicon layer. Thus, a structure is formed in which the pillar-shaped silicon layer 106 is formed in the upper portion of the fin-shaped silicon layer 103 and the first insulating film 104 is formed around the fin-shaped silicon layer 103.

As shown in FIG. 9, the second resist 105 is removed.

Next, a production method is described in which a gate insulating film 107 is formed around the pillar-shaped silicon layer 106, a metal film 108 and a polysilicon film 109 thinner than the width of the pillar-shaped silicon layer are formed around the gate insulating film 107, a third resist 110 for forming a gate line 111b is formed, and the gate line 111b is formed by performing anisotropic etching.

Figure 10:
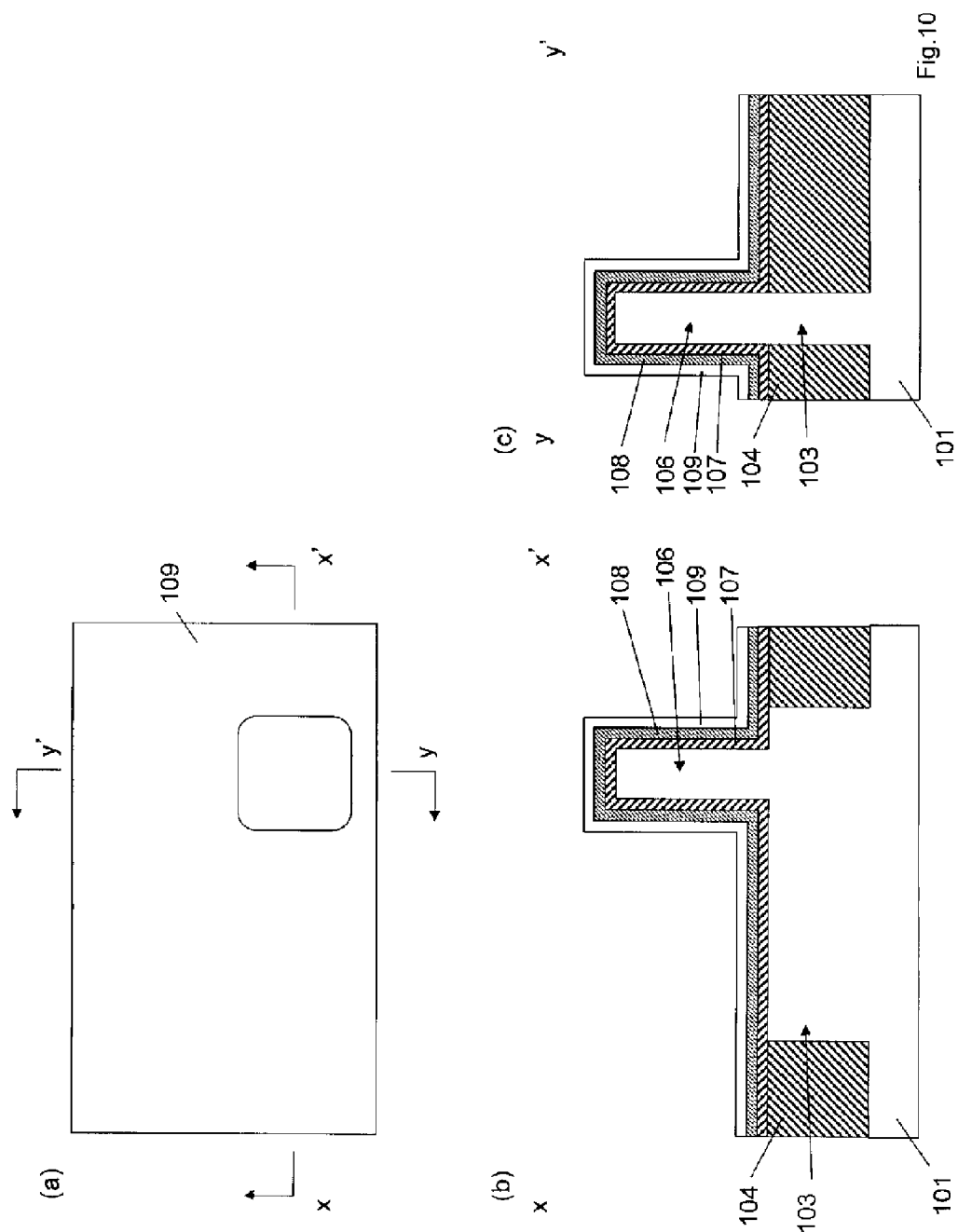
FIG. 10(a) is a plan view related to a method for producing a semiconductor device according to the present invention.
FIG. 10(b) is a cross-sectional view taken along line x-x' in (a)
FIG. 10(c) is a cross-sectional view taken along line y-y' in (a).

As shown in FIG. 10, the gate insulating film 107 is formed around the pillar-shaped silicon layer 106, and the metal film 108 and the polysilicon film 109 are formed around the gate insulating film 107. During this process, a thin polysilicon film 109 is used. Accordingly, formation of voids in the polysilicon film can be prevented. Titanium nitride may be used as the metal film 108; however, any other metal that is used in semiconductor production steps and sets the threshold voltage of transistors may be used. An insulating film commonly used in semiconductor production processes, such as an oxide film, an oxynitride film, or a high-k dielectric film, can be used as the gate insulating film 107.

Figure 11:
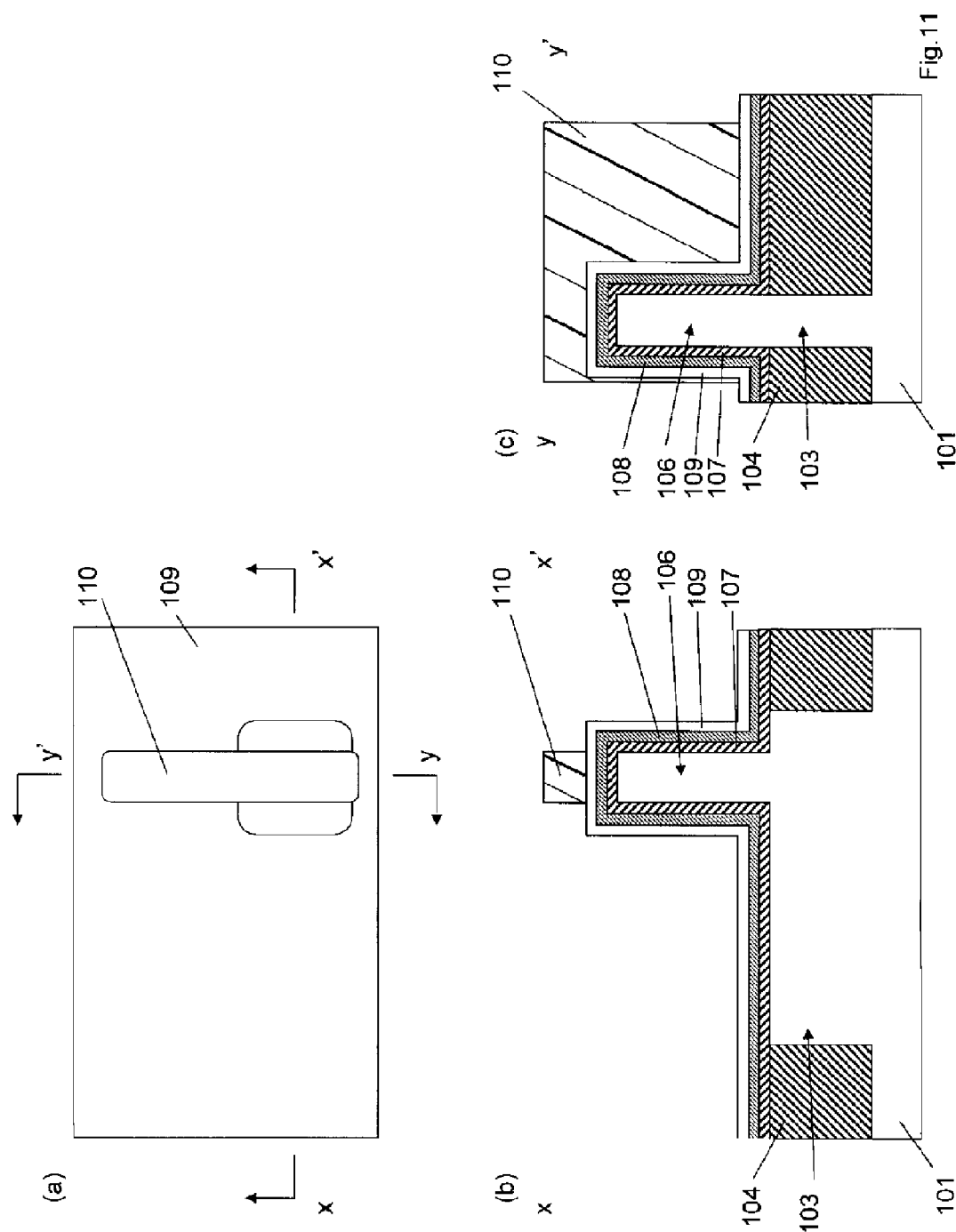
FIG. 11(a) is a plan view related to a method for producing a semiconductor device according to the present invention.
FIG. 11(b) is a cross-sectional view taken along line x-x' in (a)
FIG. 11(c) is a cross-sectional view taken along line y-y' in (a).

As shown in FIG. 11, the third resist 110 for forming the gate line 111b is formed. In this embodiment, the height of the resist is described to be higher than the pillar-shaped silicon layer. The smaller the gate line width, the easier it is for polysilicon in the upper portion of the pillar-shaped silicon layer to be exposed.

The height of the resist may be lower than the pillar-shaped silicon layer.

Figure 12:
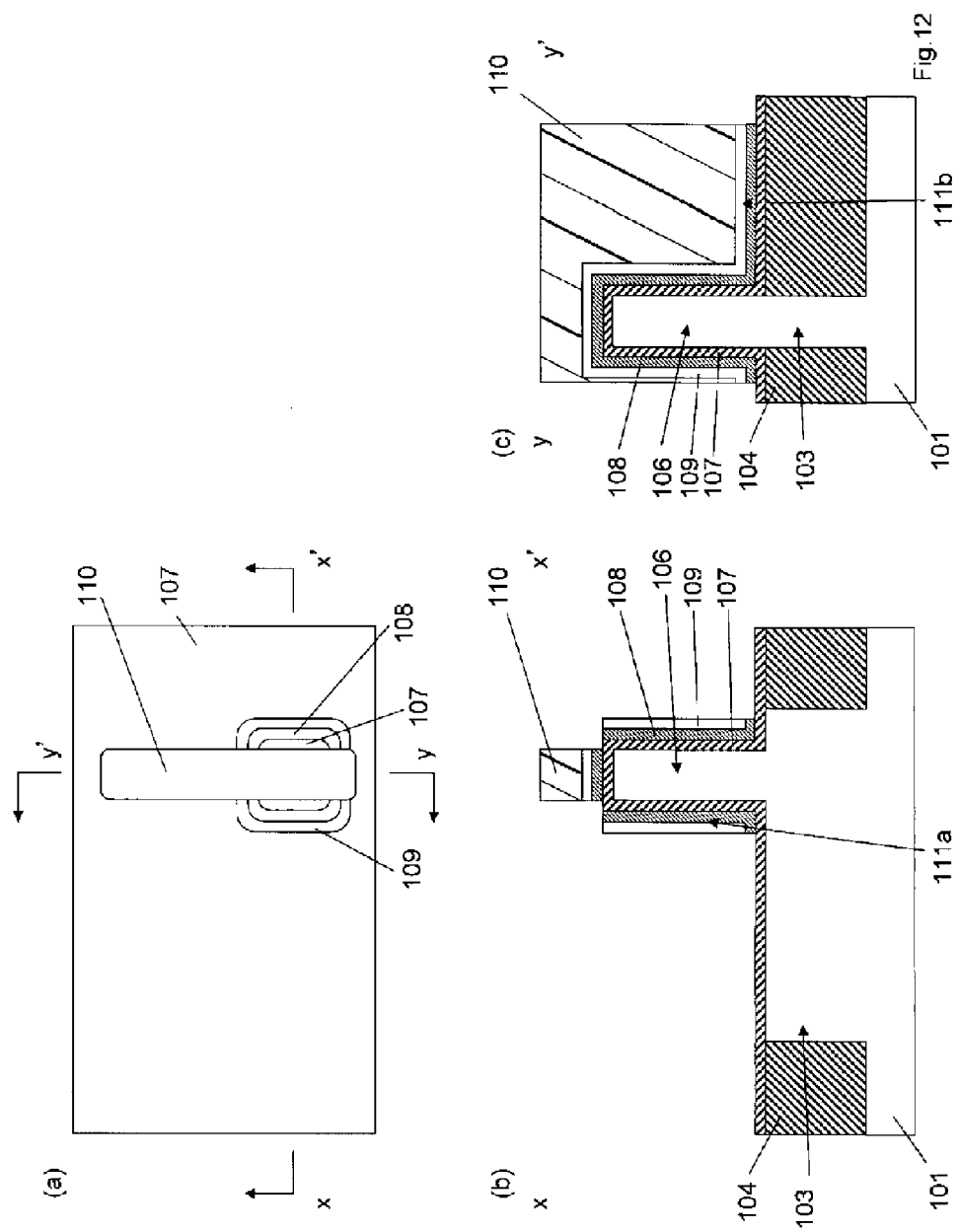
FIG. 12(a) is a plan view related to a method for producing a semiconductor device according to the present invention.
FIG. 12(b) is a cross-sectional view taken along line x-x' in (a)
FIG. 12(c) is a cross-sectional view taken along line y-y' in (a).

As shown in FIG. 12, the polysilicon film 109 and the metal film 108 are etched.

A gate electrode 111a and a gate line 111b are formed. During this process, if the resist on the upper portion of the pillar-shaped silicon layer is thin or the polysilicon in the upper portion of the pillar-shaped silicon layer is exposed, the upper portion of the pillar-shaped silicon layer may become etched during etching. To address this, at the time of forming the pillar-shaped silicon layer, the height of the pillar-shaped silicon layer may be set to be equal to the sum of the desired height of the pillar-shaped silicon layer and the height that will be removed by subsequent etching for forming the gate line. Accordingly, the production steps of the present invention are self-aligned processes.

Figure 13:
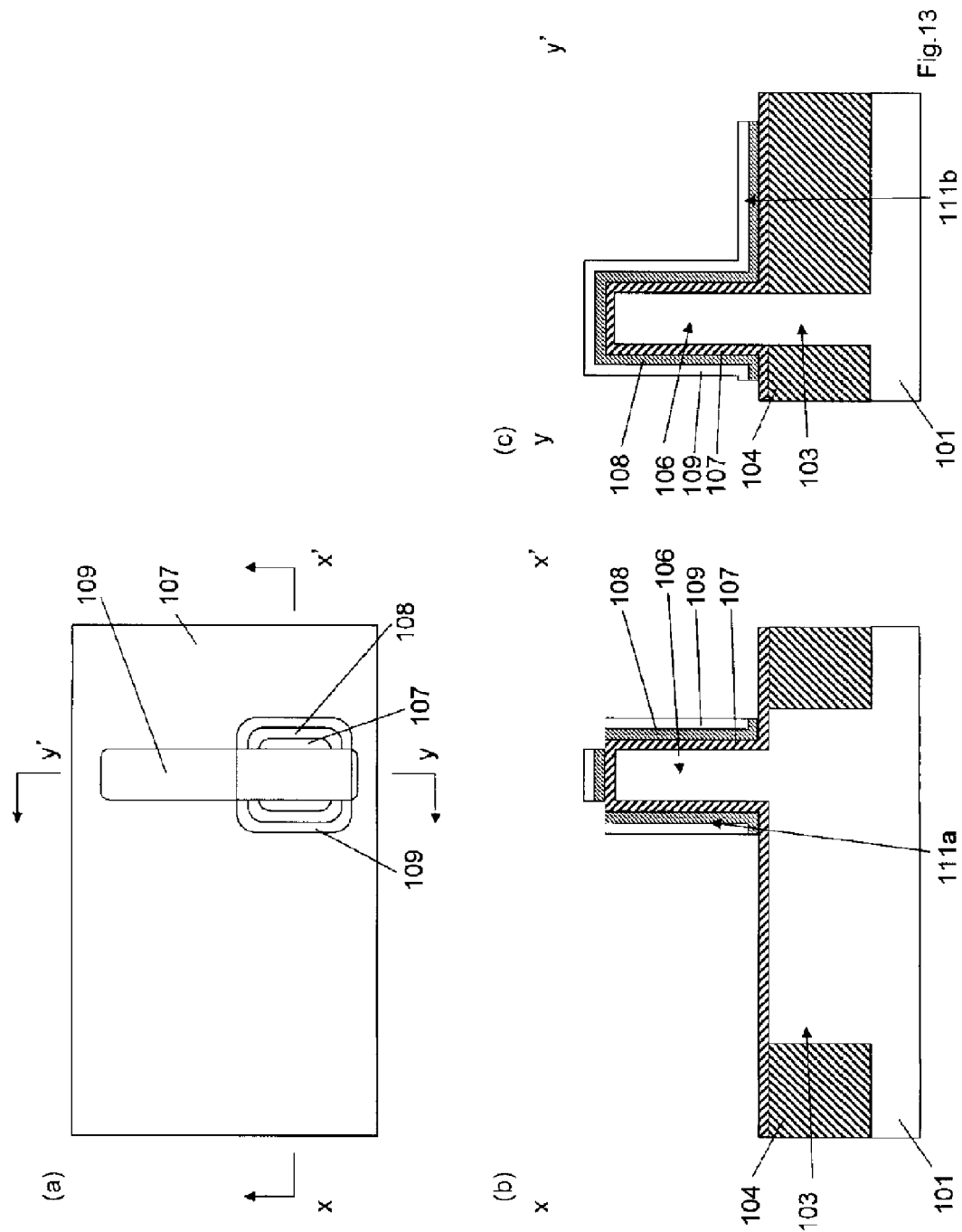
FIG. 13(a) is a plan view related to a method for producing a semiconductor device according to the present invention.
FIG. 13(b) is a cross-sectional view taken along line x-x' in (a)
FIG. 13(c) is a cross-sectional view taken along line y-y' in (a).

As shown in FIG. 13, the third resist is removed. This ends the production method in which a gate insulating film 107 is formed around the pillar-shaped silicon layer 106, a metal film 108 and a polysilicon film 109 thinner than the width of the pillar-shaped silicon layer are formed around the gate insulating film 107, a third resist 110 for forming a gate line 111b is formed, and the gate line 111b is formed by performing anisotropic etching.

Next, a production method is described in which a fourth resist 112 is deposited, the polysilicon film 109 on a sidewall of an upper portion of the pillar-shaped silicon layer 106 is exposed, the exposed polysilicon film 109 is removed by etching, the fourth resist 112 is removed, the metal film 108 is removed by etching, and a gate electrode 111a connected to the gate line 111b is formed.

Figure 14:
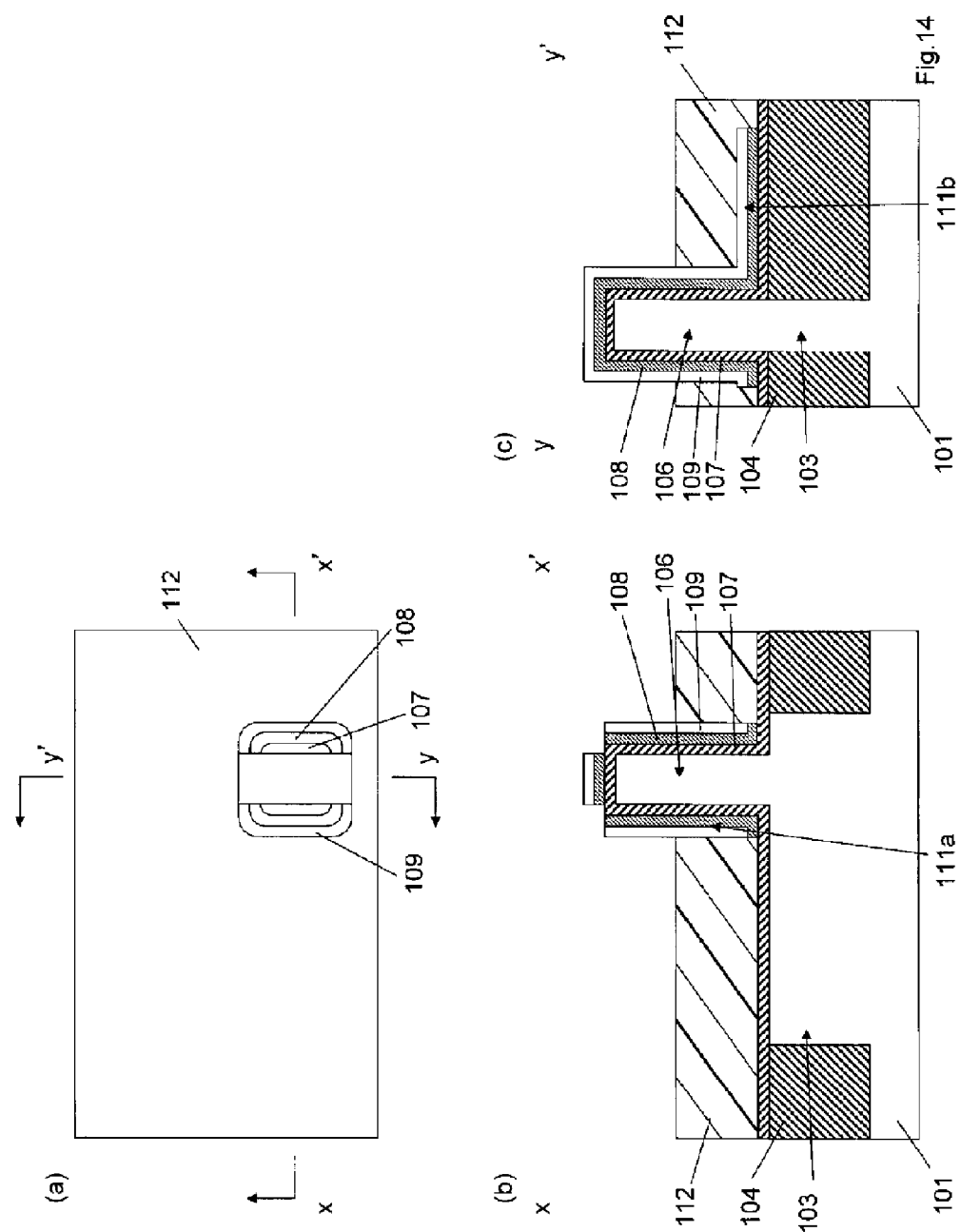
FIG. 14(a) is a plan view related to a method for producing a semiconductor device according to the present invention.
FIG. 14(b) is a cross-sectional view taken along line x-x' in (a)
FIG. 14(c) is a cross-sectional view taken along line y-y' in (a).

As shown in FIG. 14, the fourth resist 112 is deposited and the polysilicon film 109 on the sidewall of the upper portion of the pillar-shaped silicon layer 106 is exposed. Resist etch back is preferably employed. Alternatively, a coating film such as a spin-on-glass may be used.

Figure 15:
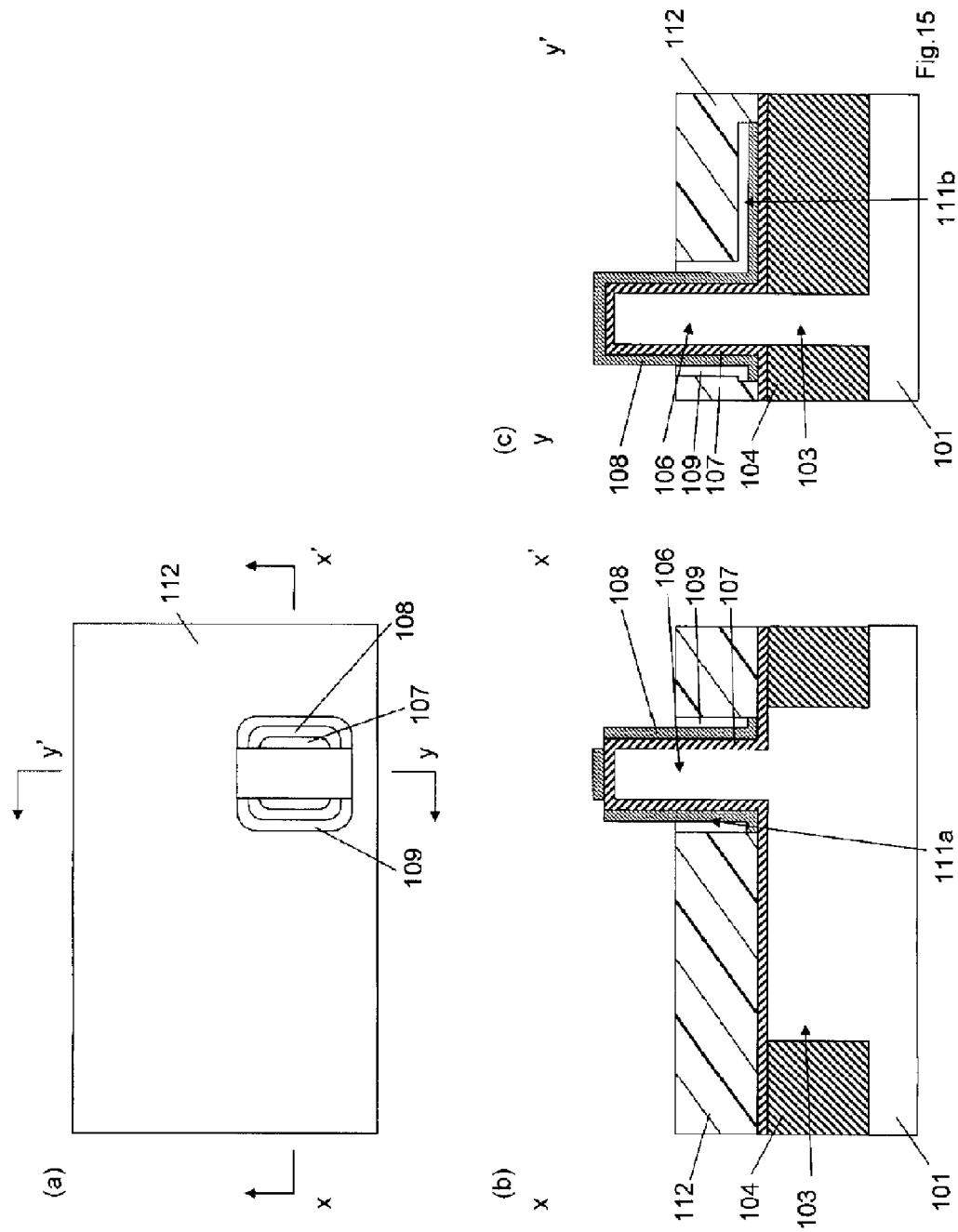
FIG. 15(a) is a plan view related to a method for producing a semiconductor device according to the present invention.
FIG. 15(b) is a cross-sectional view taken along line x-x' in (a)
FIG. 15(c) is a cross-sectional view taken along line y-y' in (a).

As shown in FIG. 15, the exposed polysilicon film 109 is removed by etching. Isotropic dry etching is preferably employed.

Figure 16:
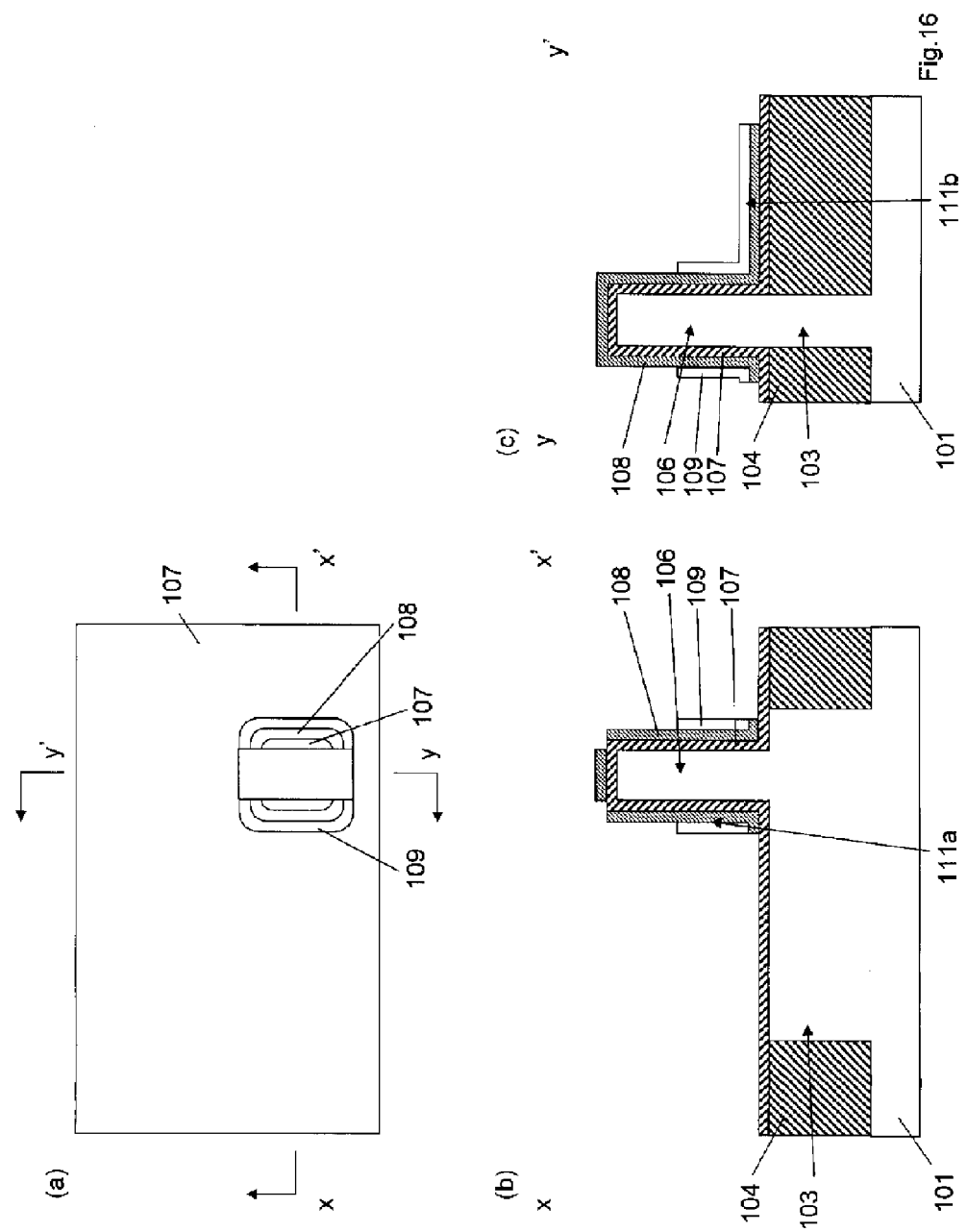
FIG. 16(a) is a plan view related to a method for producing a semiconductor device according to the present invention.
FIG. 16(b) is a cross-sectional view taken along line x-x' in (a)
FIG. 16(c) is a cross-sectional view taken along line y-y' in (a).

As shown in FIG. 16, the fourth resist 112 is removed.

Figure 17:
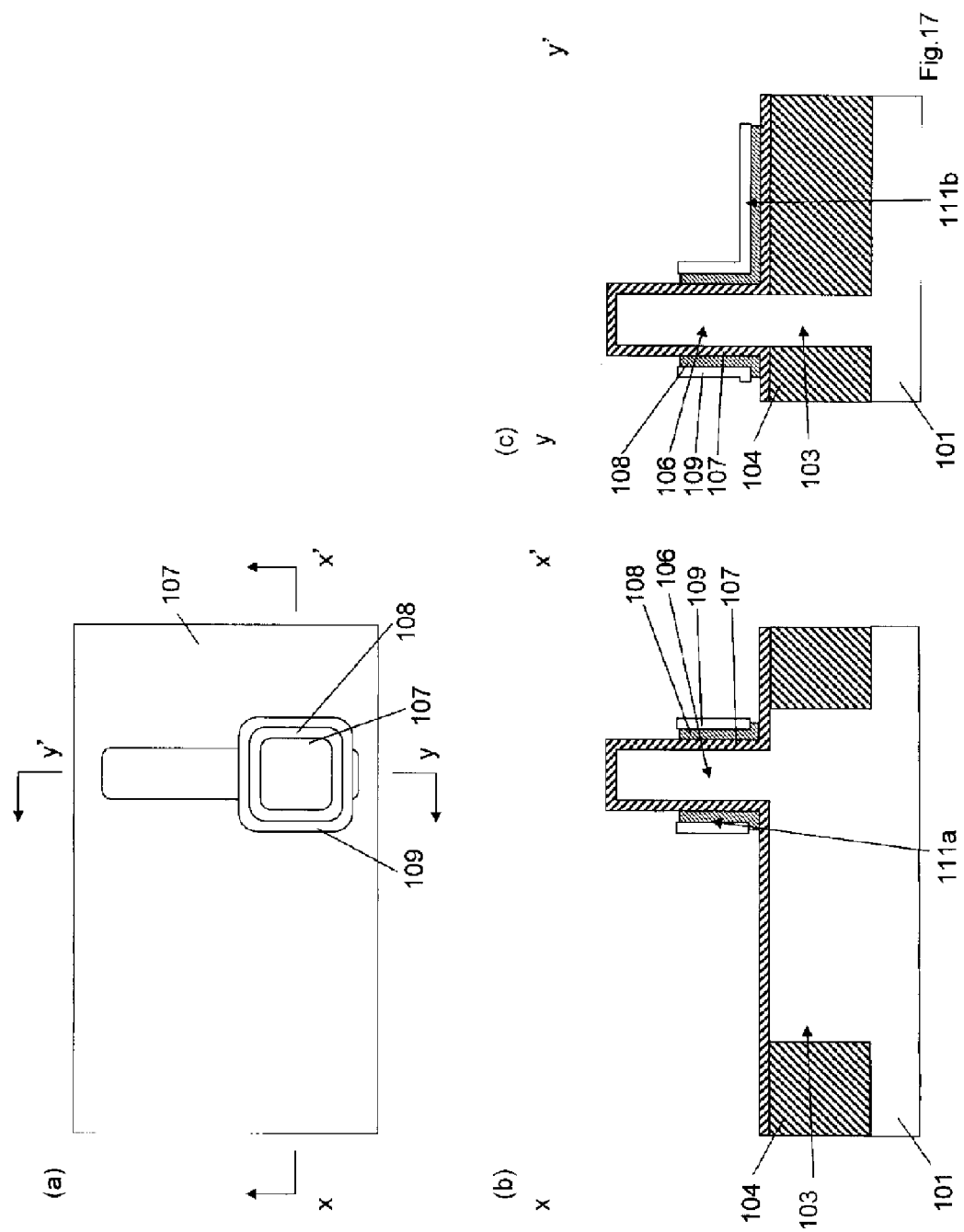
FIG. 17(a) is a plan view related to a method for producing a semiconductor device according to the present invention.
FIG. 17(b) is a cross-sectional view taken along line x-x' in (a)
FIG. 17(c) is a cross-sectional view taken along line y-y' in (a).

As shown in FIG. 17, the metal film 108 is removed by etching so that the metal film 108 remains on the sidewall of the pillar-shaped silicon layer 106. Isotropic etching is preferably employed. The metal film 108 and the polysilicon film 109 on the sidewall of the pillar-shaped silicon layer 106 form the gate electrode 111a. Accordingly, this is a self-aligned process.

This ends the description of the production method in which a fourth resist 112 is deposited, the polysilicon film 109 on a sidewall of an upper portion of the pillar-shaped silicon layer 106 is exposed, the exposed polysilicon film 109 is removed by etching, the fourth resist 112 is removed, the metal film 108 is removed by etching, and a gate electrode 111a connected to the gate line 111b is formed.

Next, a production method is described in which a first diffusion layer 114 is formed in an upper portion of the pillar-shaped silicon layer 106 and a second diffusion layer 113 is formed in a lower portion of the pillar-shaped silicon layer 106 and an upper portion of the fin-shaped silicon layer 103.

As shown in FIG. 18, arsenic is implanted to form the first diffusion layer 114 and the second diffusion layer 113. In the case of pMOS, boron or boron fluoride is implanted.

Figure 19:
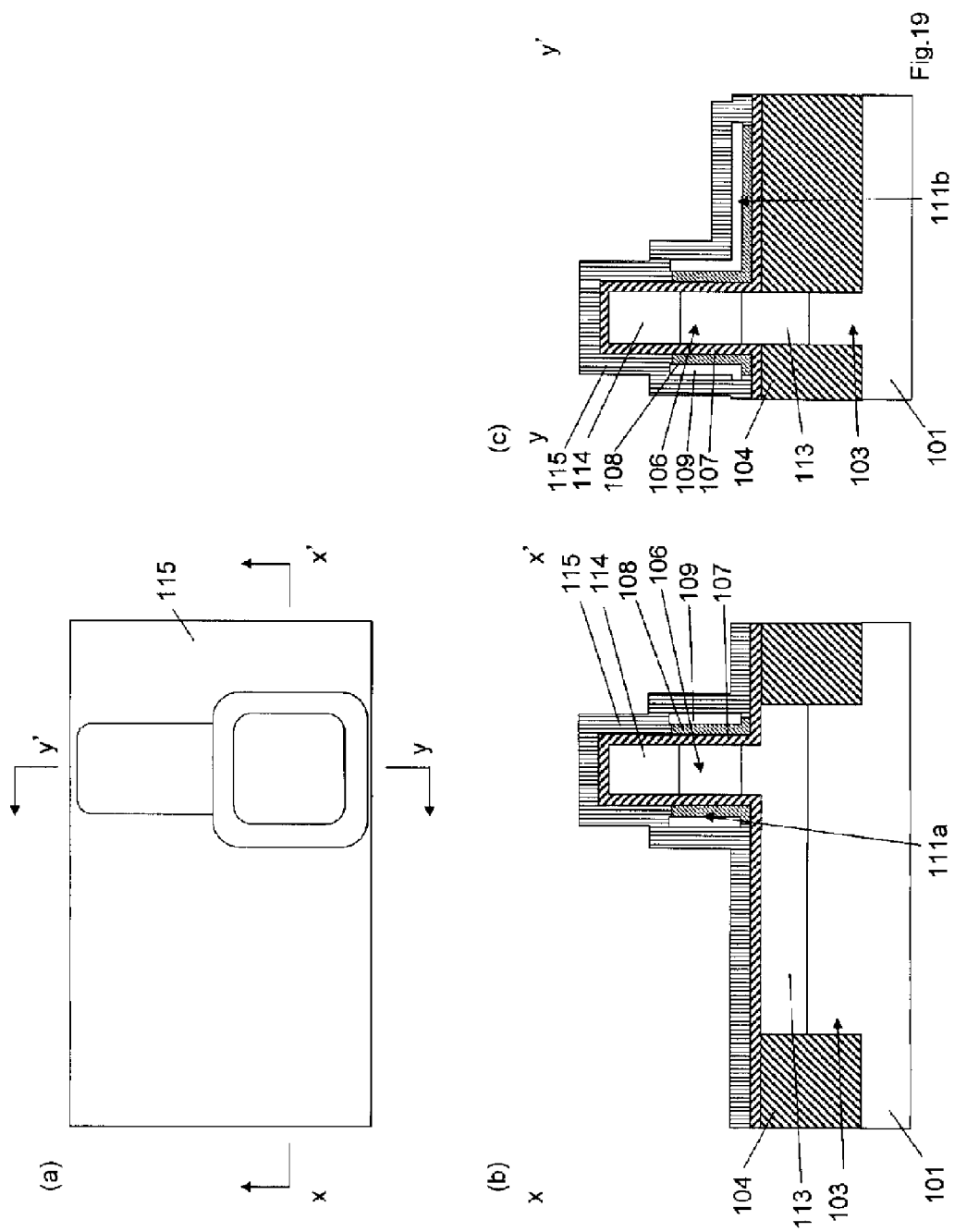
FIG. 19(a) is a plan view related to a method for producing a semiconductor device according to the present invention.
FIG. 19(b) is a cross-sectional view taken along line x-x' in (a)
FIG. 19(c) is a cross-sectional view taken along line y-y' in (a).

As shown in FIG. 19, a nitride film 115 is deposited and a heat treatment is performed.

This ends the description of the production in which a first diffusion layer 114 is formed in an upper portion of the pillar-shaped silicon layer 106 and a second diffusion layer 113 is formed in a lower portion of the pillar-shaped silicon layer 106 and an upper portion of the fin-shaped silicon layer 103.

Next, a production method is described in which silicides are formed in the first diffusion layer 114, the second diffusion layer 113, and the gate line 111b.

Figure 20:
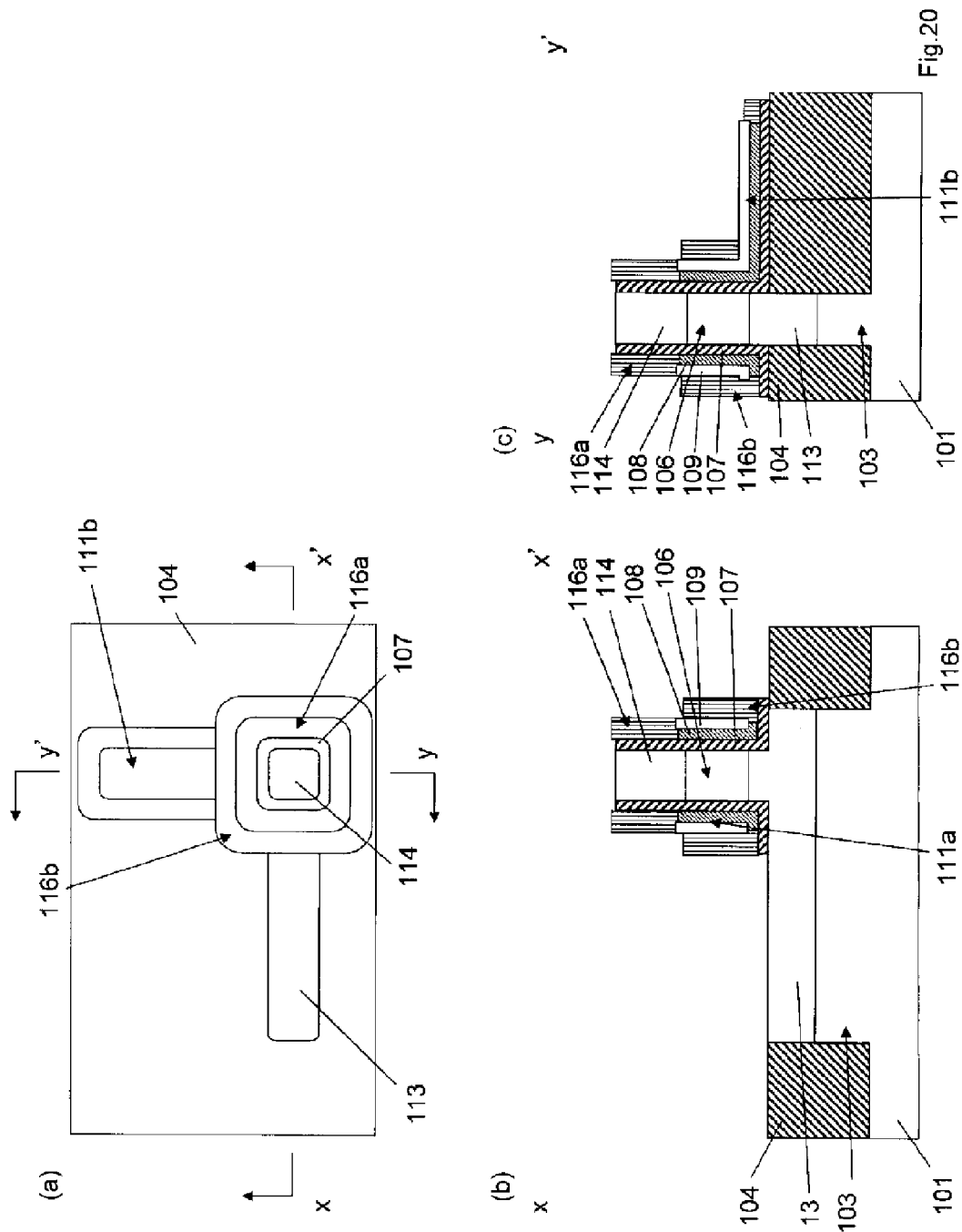
FIG. 20(a) is a plan view related to a method for producing a semiconductor device according to the present invention.
FIG. 20(b) is a cross-sectional view taken along line x-x' in (a)
FIG. 20(c) is a cross-sectional view taken along line y-y' in (a).

As shown in FIG. 20, the nitride film 115 is etched to form nitride film sidewalls 116a and 116b.

Figure 21:
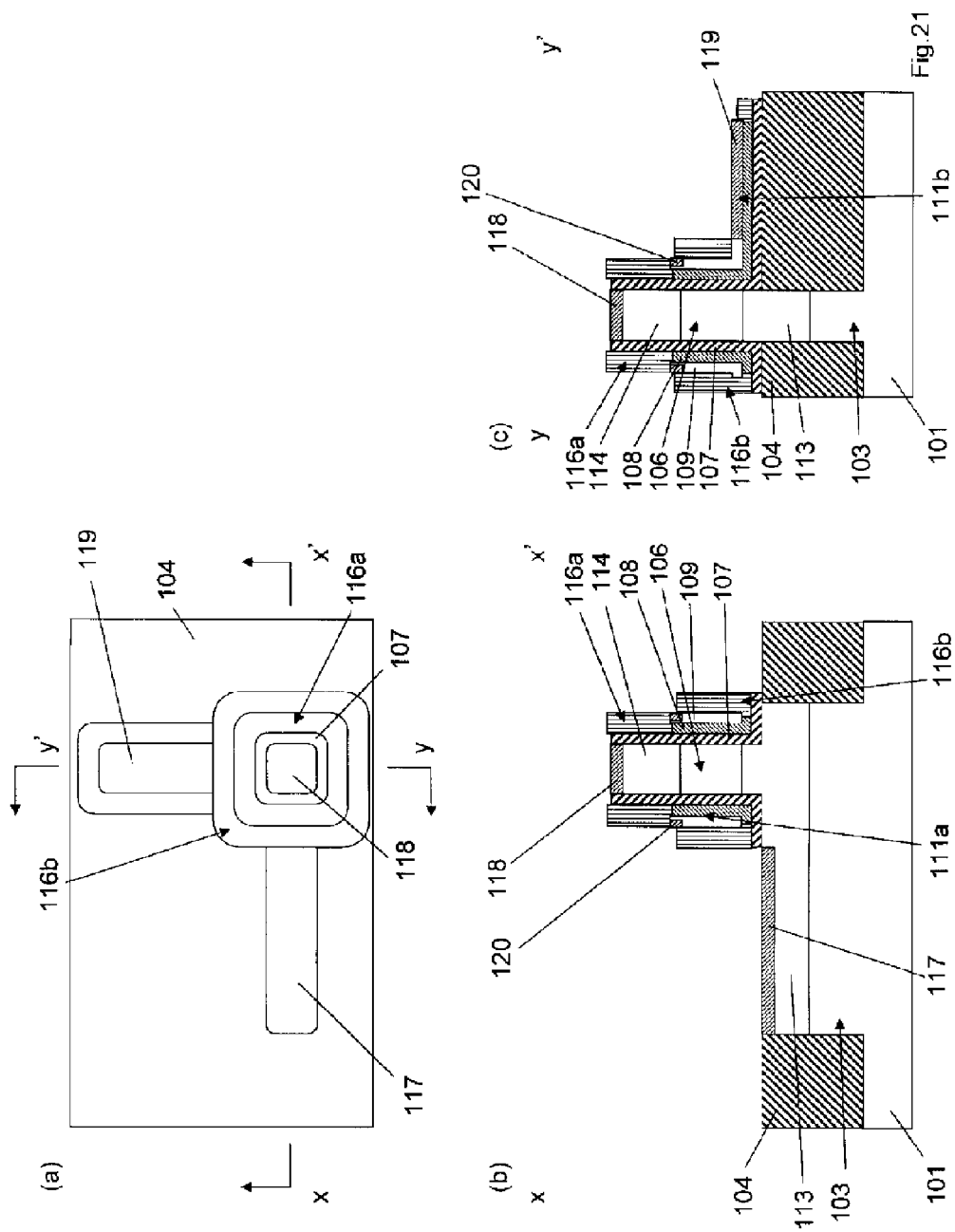
FIG. 21(a) is a plan view related to a method for producing a semiconductor device according to the present invention.
FIG. 21(b) is a cross-sectional view taken along line x-x' in (a)
FIG. 21(c) is a cross-sectional view taken along line y-y' in (a).

Next, as shown in FIG. 21, a metal is deposited and heat-treated and the unreacted metal is removed so as to form silicides 118, 117, and 119 on the first diffusion layer 114, on the second diffusion layer 113, and in the gate line 111b. In the case where the upper portion of the gate electrode 111a is exposed, a silicide 120 is formed in the upper portion of the gate electrode 111a.

Since the polysilicon film 109 is thin, the gate line 111b tends to have a laminated structure constituted by the metal film 108 and the silicide 119. Since the silicide 119 and the metal film 108 come into direct contact with each other, the resistance can be decreased.

This ends the description of the production method for forming silicides in the first diffusion layer 114, the second diffusion layer 113, and the gate line 111b.

As shown in FIG. 22, a contact stopper 140 such as a nitride film is formed and an interlayer insulating film 121 is formed.

As shown in FIG. 23, a fifth resist 122 for forming contact holes 123 and 124 is formed.

Figure 24:
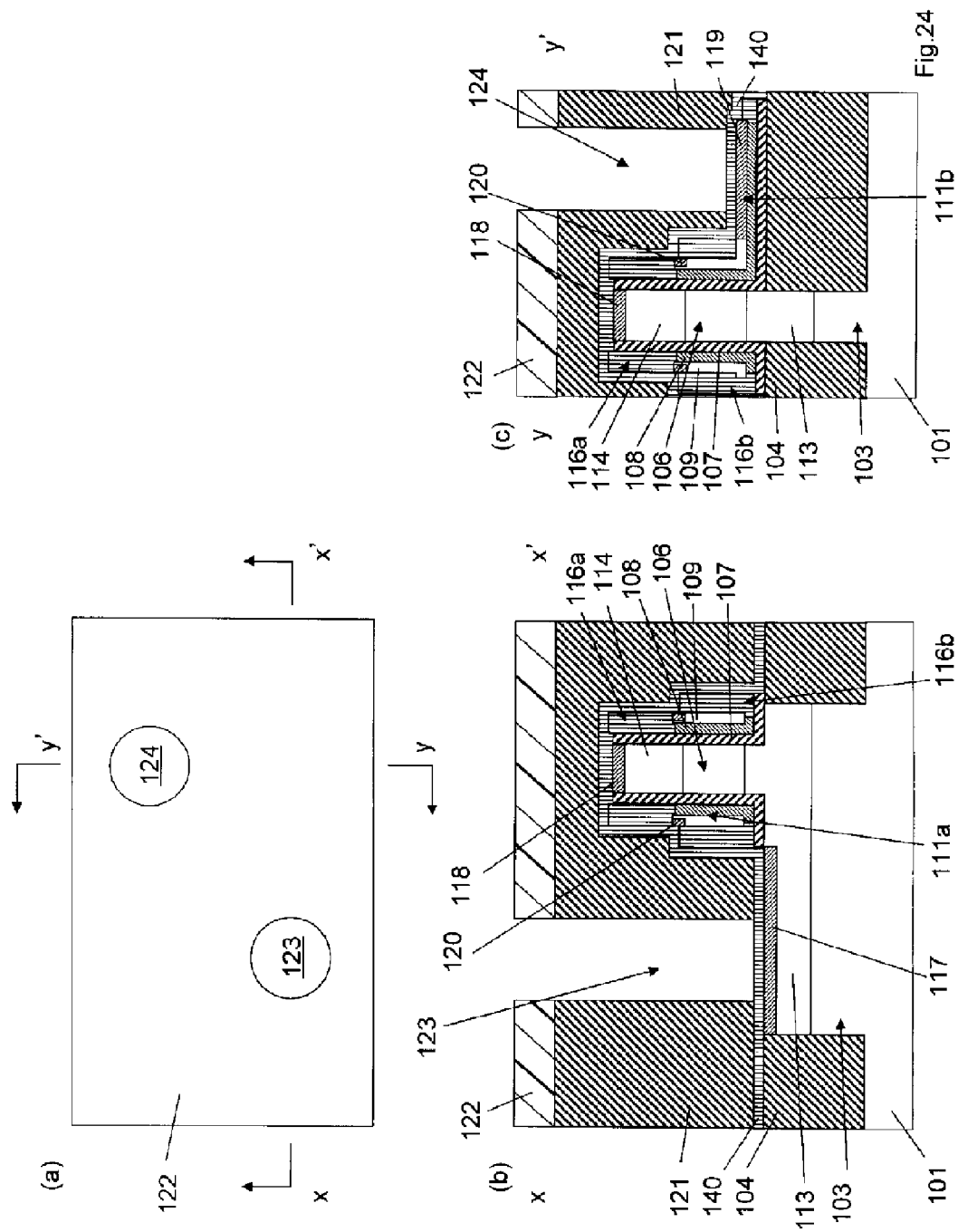
FIG. 24(a) is a plan view related to a method for producing a semiconductor device according to the present invention.
FIG. 24(b) is a cross-sectional view taken along line x-x' in (a)
FIG. 24(c) is a cross-sectional view taken along line y-y' in (a).

As shown in FIG. 24, the interlayer insulating film 121 is etched to form the contact holes 123 and 124.

Figure 25:
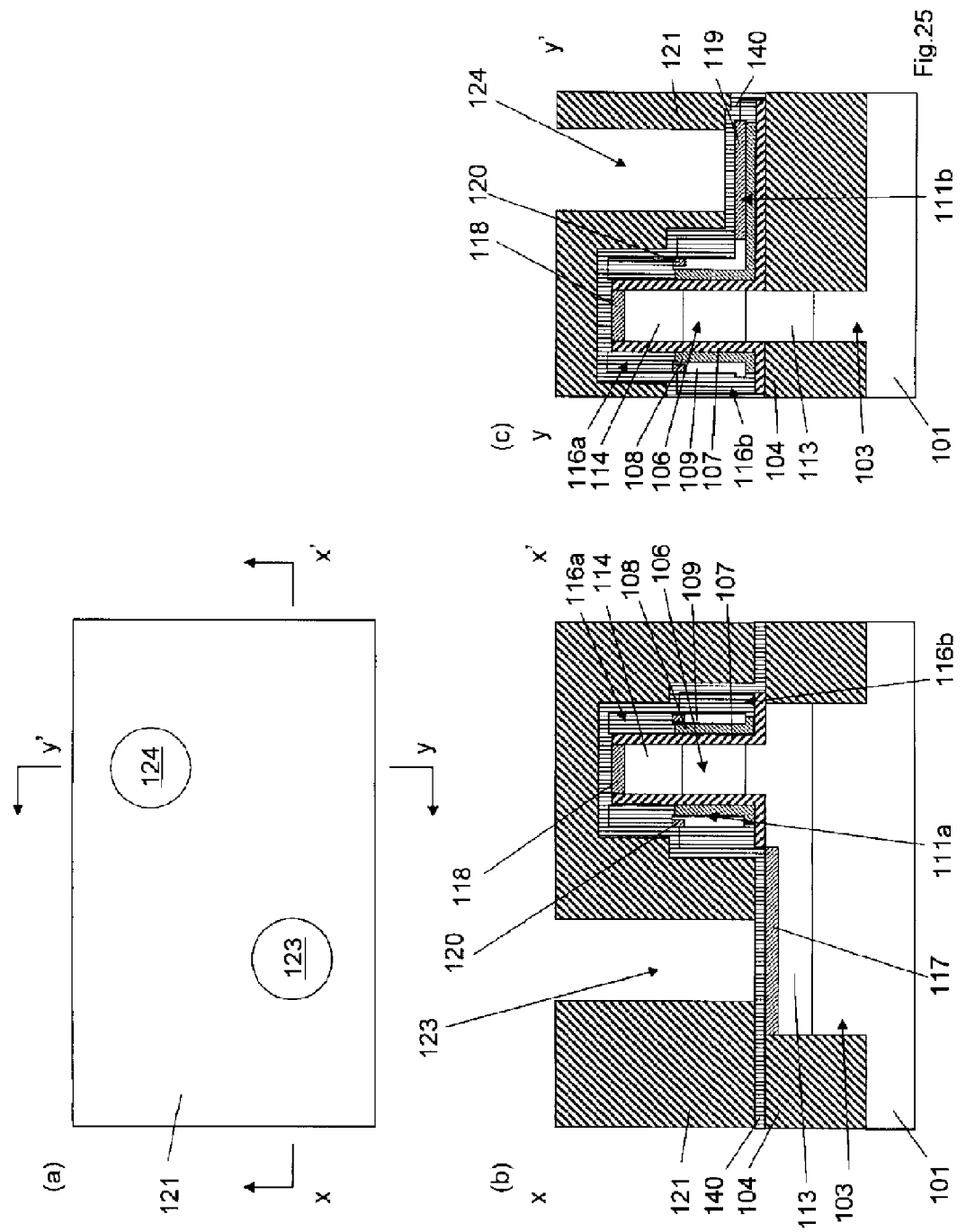
FIG. 25(a) is a plan view related to a method for producing a semiconductor device according to the present invention.
FIG. 25(b) is a cross-sectional view taken along line x-x' in (a)
FIG. 25(c) is a cross-sectional view taken along line y-y' in (a).

As shown in FIG. 25, the fifth resist 122 is removed.

Figure 26:
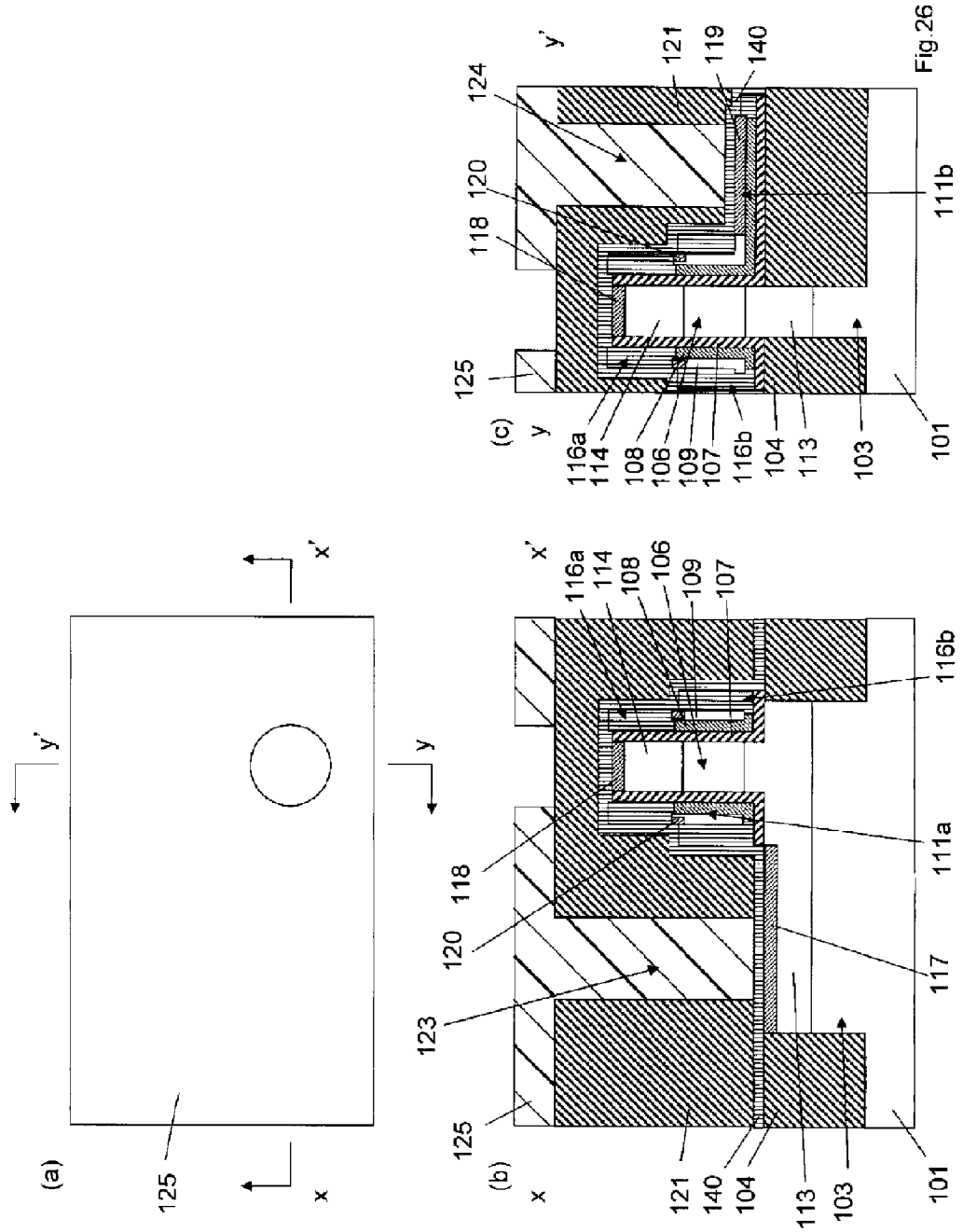
FIG. 26(a) is a plan view related to a method for producing a semiconductor device according to the present invention.
FIG. 26(b) is a cross-sectional view taken along line x-x' in (a)
FIG. 26(c) is a cross-sectional view taken along line y-y' in (a).

As shown in FIG. 26, a sixth resist 125 for forming a contact hole 126 is formed.

Figure 27:
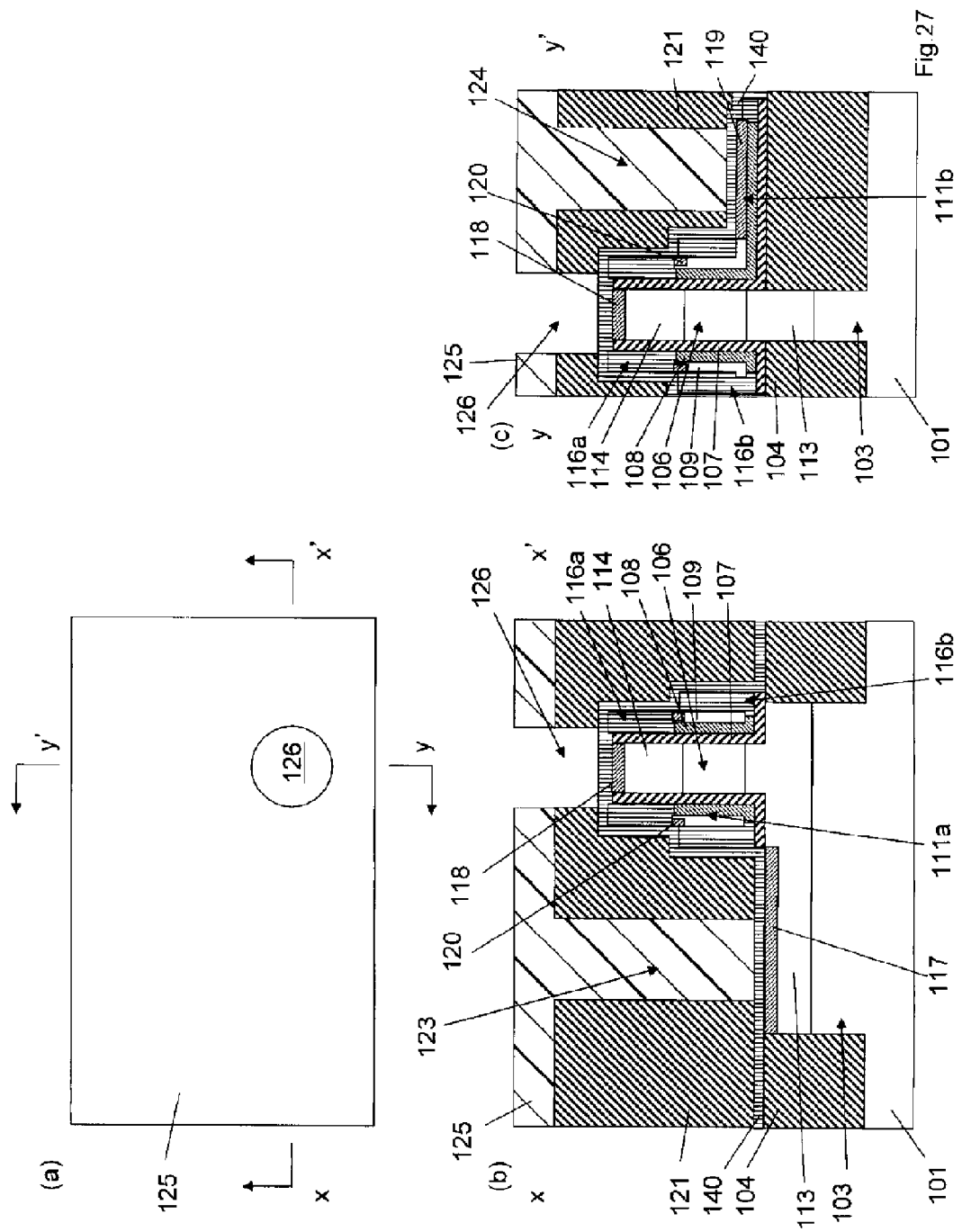
FIG. 27(a) is a plan view related to a method for producing a semiconductor device according to the present invention.
FIG. 27(b) is a cross-sectional view taken along line x-x' in (a)
FIG. 27(c) is a cross-sectional view taken along line y-y' in (a).

As shown in FIG. 27, the interlayer insulating film 121 is etched to form the contact hole 126.

Figure 28:
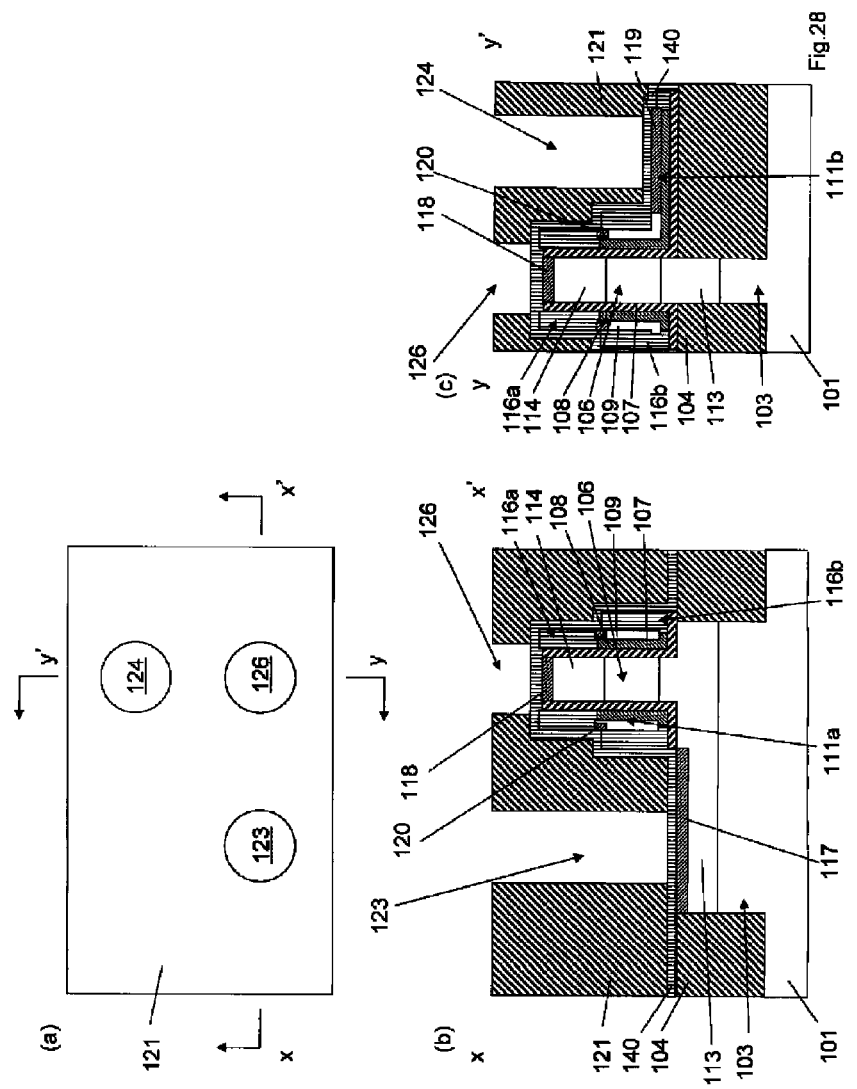
FIG. 28(a) is a plan view related to a method for producing a semiconductor device according to the present invention.
FIG. 28(b) is a cross-sectional view taken along line x-x' in (a)
FIG. 28(c) is a cross-sectional view taken along line y-y' in (a).

As shown in FIG. 28, the sixth resist 125 is removed.

Figure 29:
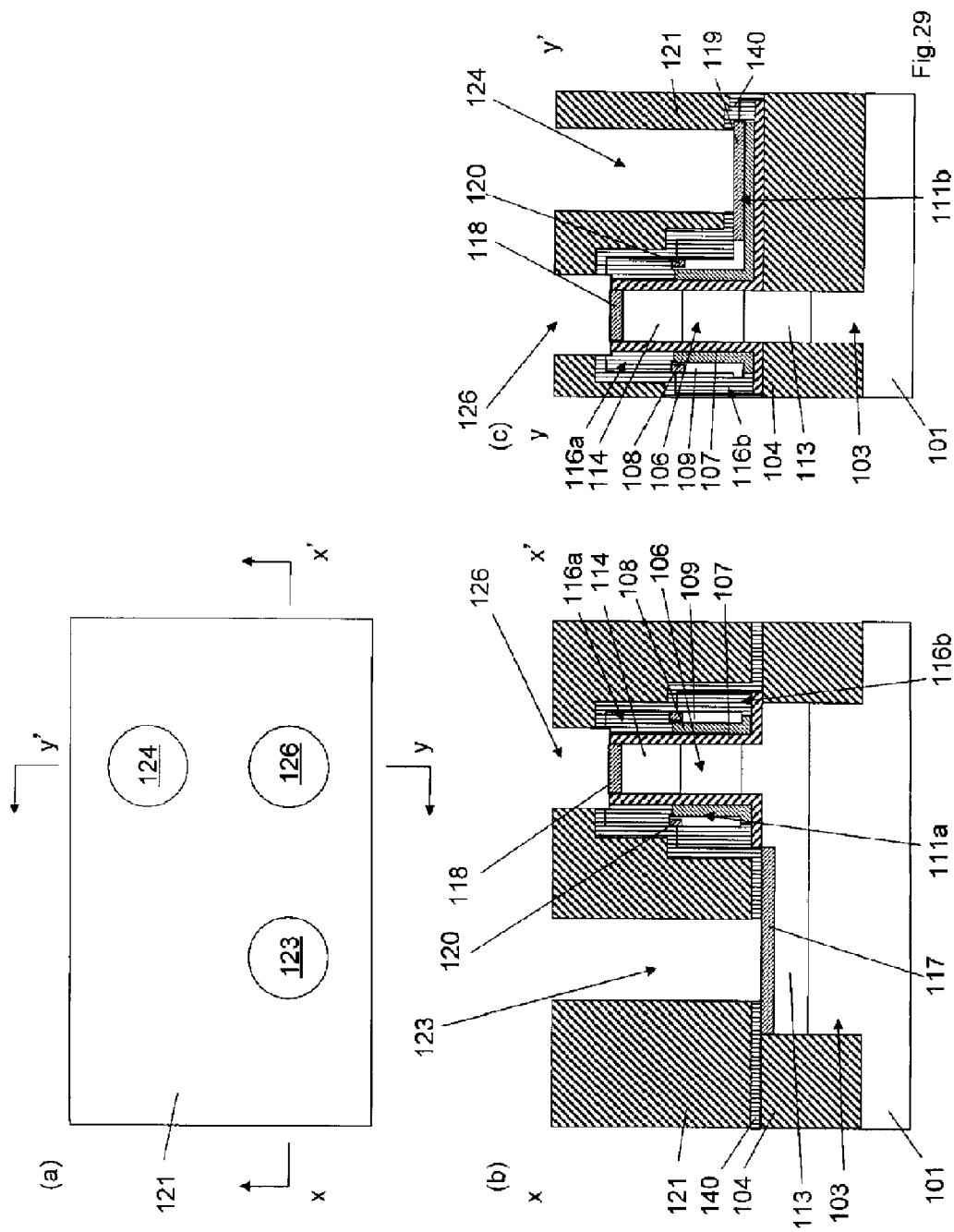
FIG. 29(a) is a plan view related to a method for producing a semiconductor device according to the present invention.
FIG. 29(b) is a cross-sectional view taken along line x-x' in (a)
FIG. 29(c) is a cross-sectional view taken along line y-y' in (a).

As shown in FIG. 29, the contact stopper 140 at the bottoms of the contact holes 123, 124, and 126 are removed by etching.

Figure 30:
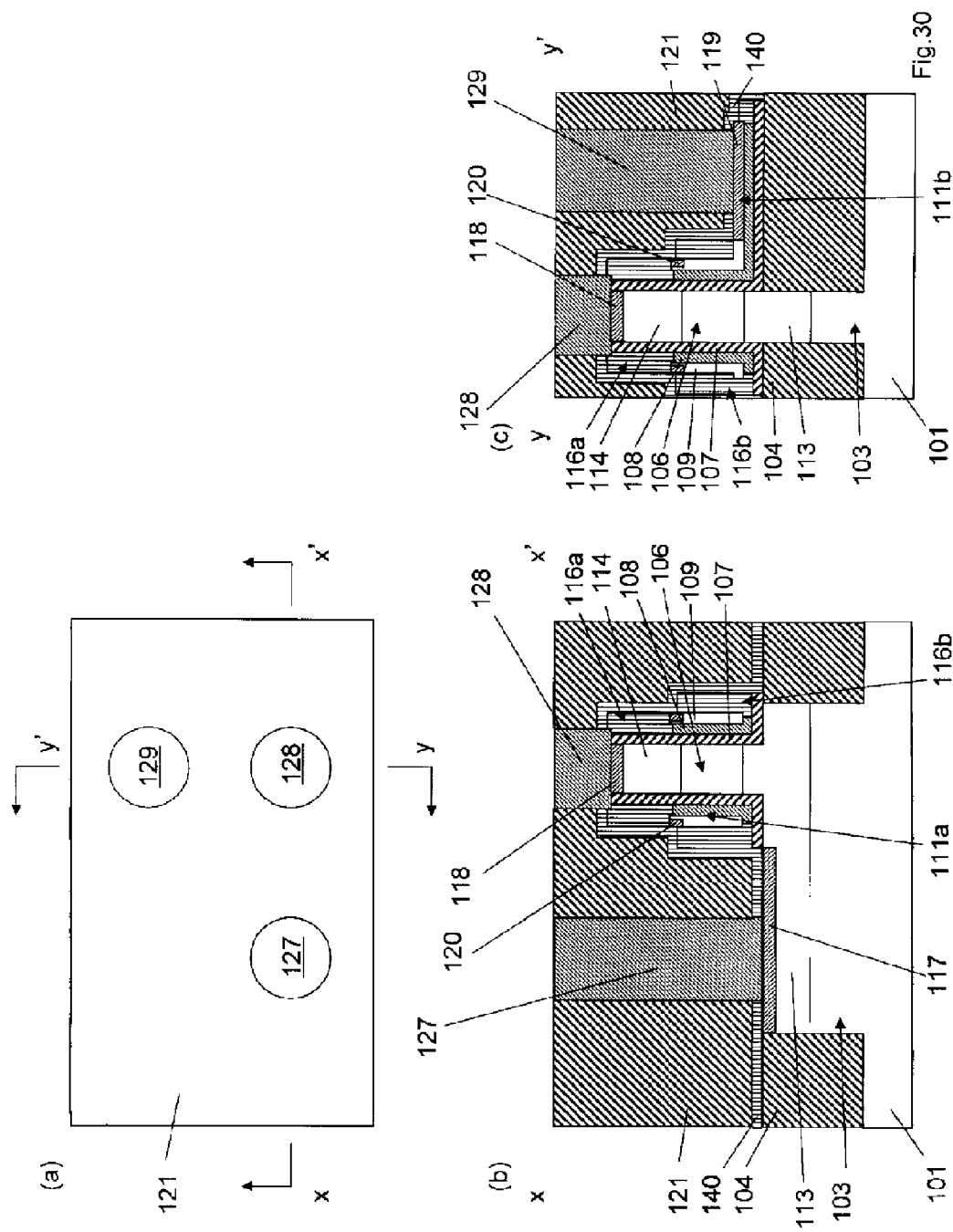
FIG. 30(a) is a plan view related to a method for producing a semiconductor device according to the present invention.
FIG. 30(b) is a cross-sectional view taken along line x-x' in (a)
FIG. 30(c) is a cross-sectional view taken along line y-y' in (a).

Next, as shown in FIG. 30, a metal is deposited to form contacts 127, 128, and 129.

Figure 31:
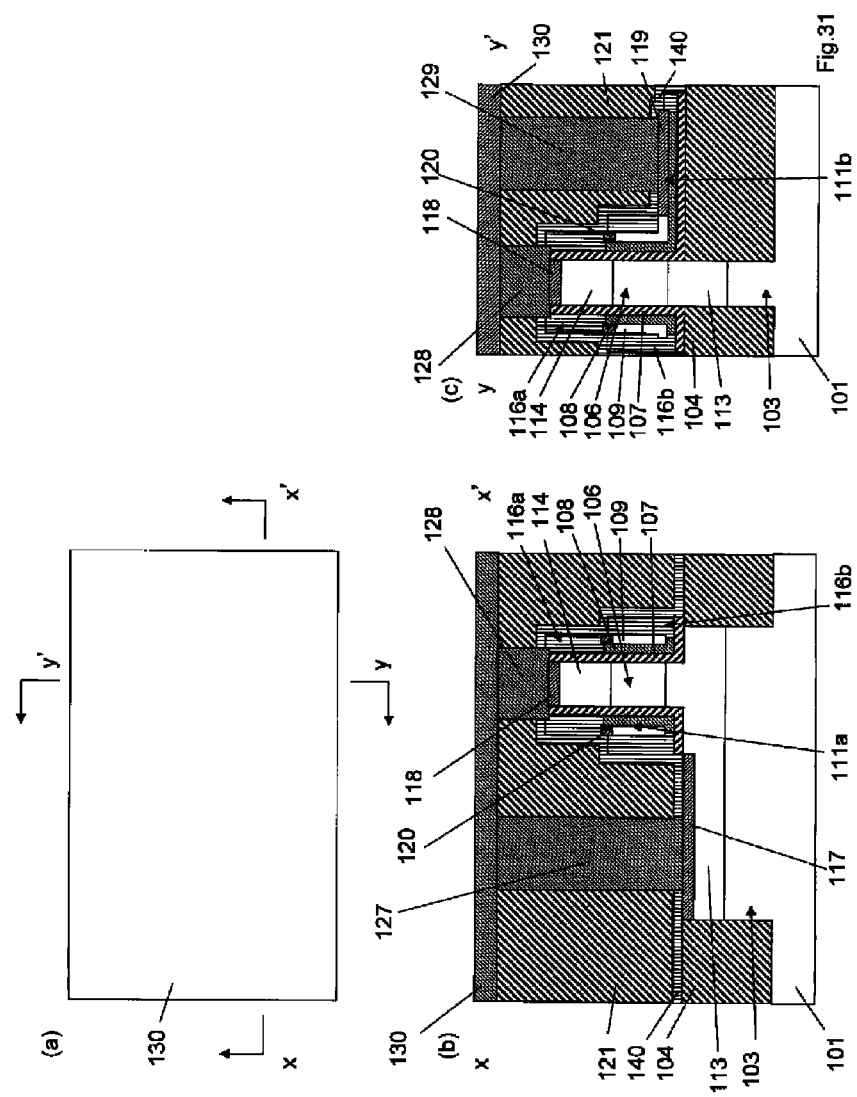
FIG. 31(a) is a plan view related to a method for producing a semiconductor device according to the present invention.
FIG. 31(b) is a cross-sectional view taken along line x-x' in (a)
FIG. 31(c) is a cross-sectional view taken along line y-y' in (a).

Next, as shown in FIG. 31, a metal 130 for metal wires is deposited.

Next, as shown in FIG. 32, seventh resists 131, 132, and 133 for forming metal wires are formed.

Next, as shown in FIG. 33, the metal 130 is etched to form metal wires 134, 135, and 136.

Then, as shown in FIG. 34, the seventh resists 131, 132, and 133 are removed.

This ends the description of a method for producing a SGT thorough a self-aligned process, in which the parasitic capacitance between the gate line and the substrate is reduced, a thin gate material is used, and a metal gate is used.

FIG. 1 shows a structure of a semiconductor device obtained through the production method described above. As shown in FIG. 1, the semiconductor device includes a fin-shaped silicon layer 103 formed on a silicon substrate 101; a first insulating film 104 formed around the fin-shaped silicon layer 103; a pillar-shaped silicon layer 106 having a width equal to the width of the fin-shaped silicon layer 103 and being formed on the fin-shaped silicon layer 103; a gate insulating film 107 formed around the pillar-shaped silicon layer 106; a gate electrode 111a having a laminated structure that includes a metal film 108 and a polysilicon film 109 formed around the gate insulating film 107, the polysilicon film 109 having a thickness smaller than the width of the pillar-shaped silicon layer 106; a gate line 111b that is connected to the gate electrode 111a and extends in a direction orthogonally intersecting the fin-shaped silicon layer 103; a second diffusion layer 113 formed in an upper portion of the fin-shaped silicon layer 103 and a lower portion of the pillar-shaped silicon layer 106; a first diffusion layer 114 formed in an upper portion of the pillar-shaped silicon layer 106; a silicide 117 formed in an upper portion of the second diffusion layer 113; and a silicide 118 formed in an upper portion of the first diffusion layer 114.

The gate line 111b has a laminated structure that includes the metal film 108 and the silicide 119. Since the silicide 119 and the metal film 108 come into direct contact with each other, the resistance can be decreased.

It should be noted that various embodiments and modifications are possible without departing from the spirit and scope of the present invention in a broad sense. Moreover, the embodiments described above are for explaining examples of the present invention and do not limit the scope of the present invention.

For example, a method for producing a semiconductor device in which p-type (p+ type is also included) and n-type (n+ type is also included) are reversed from that described in the embodiments described above, and a semiconductor device obtained by such a method are also within the technical scope of the present invention.

The invention claimed is:

1. A method for producing a semiconductor device, the method comprising:
    a first step of forming a fin-shaped silicon layer on a silicon substrate, forming a first insulating film around the fin-shaped silicon layer, and forming a pillar-shaped silicon layer in an upper portion of the fin-shaped silicon layer, the pillar-shaped silicon layer having a width equal to a width of the fin-shaped silicon layer;
    subsequent to the first step, a second step of forming a gate insulating film around the pillar-shaped silicon layer, forming a metal film and a polysilicon film around the gate insulating film, forming a third resist for forming a gate line, and performing anisotropic etching to form the gate line, the polysilicon film having a thickness smaller than the width of the pillar-shaped silicon layer; and
    subsequent to the second step, a third step of depositing a fourth resist, exposing the polysilicon film on a sidewall of an upper portion of the pillar-shaped silicon layer, removing the exposed polysilicon film by etching, removing the fourth resist, removing the metal film by etching, and forming a gate electrode connecting to the gate line.

2. The method for producing a semiconductor device according to claim 1, wherein the first step comprises:
    forming a first resist for forming the fin-shaped silicon layer on the silicon substrate, etching the silicon substrate, forming the fin-shaped silicon layer, removing the first resist, depositing the first insulating film around the fin-shaped silicon layer, etching back the first insulating film, exposing an upper portion of the fin-shaped silicon layer, forming a second resist that orthogonally intersects the fin-shaped silicon layer, etching the fin-shaped silicon layer, and removing the second resist so that a portion where the fin-shaped silicon layer orthogonally intersects the second resist forms the pillar-shaped silicon layer.

3. The method for producing a semiconductor device according to claim 1, further comprising a fourth step of forming a first diffusion layer in an upper portion of the pillar-shaped silicon layer and forming a second diffusion layer in a lower portion of the pillar-shaped silicon layer and an upper portion of the fin-shaped silicon layer.

4. The method for producing a semiconductor device according to claim 3, further comprising a fifth step of forming silicides on the first diffusion layer, on the second diffusion layer, and in the gate line.

* * * * *